US008060138B2

(12) United States Patent
Fux et al.

(10) Patent No.: US 8,060,138 B2
(45) Date of Patent: *Nov. 15, 2011

(54) HANDHELD ELECTRONIC DEVICE AND ASSOCIATED METHOD EMPLOYING A MULTIPLE-AXIS INPUT DEVICE AND PROVIDING A LEARNING FUNCTION IN A TEXT DISAMBIGUATION ENVIRONMENT

(75) Inventors: Vadim Fux, Waterloo (CA); Michael Elizarov, Waterloo (CA); Sergey V. Kolomiets, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 1132 days.

This patent is subject to a terminal disclaimer.

(21) Appl. No.: 11/831,065

(22) Filed: Jul. 31, 2007

(65) Prior Publication Data
US 2008/0010050 A1 Jan. 10, 2008

Related U.S. Application Data

(63) Continuation-in-part of application No. 10/859,444, filed on Jun. 2, 2004, now Pat. No. 7,389,124.

(51) Int. Cl.
*H04M 1/00* (2006.01)
(52) U.S. Cl. .................. 455/556.2; 455/550.1; 455/418; 455/425; 455/90.3; 345/168; 715/780
(58) Field of Classification Search ............... 455/550.1, 455/418, 556.2, 425, 90.1–90.3, 564–565; 704/1–10; 345/168–172; 341/11, 26; 715/780, 715/810–818
See application file for complete search history.

(56) References Cited

U.S. PATENT DOCUMENTS

| 5,818,437 A | 10/1998 | Grover et al. |
| 5,953,541 A | 9/1999 | King et al. |
| 5,963,671 A | 10/1999 | Strohm et al. |
| 6,011,554 A | 1/2000 | King et al. |

(Continued)

FOREIGN PATENT DOCUMENTS

CN    1248333 A    3/2000

(Continued)

OTHER PUBLICATIONS

Examination Report in corresponding Great Britain Application No. GB0625978.2, mailed by the UK Intellectual Property Office on Jul. 19, 2007 (4 pages).

(Continued)

*Primary Examiner* — Kamran Afshar
*Assistant Examiner* — Yousef Rod
(74) *Attorney, Agent, or Firm* — Finnegan, Henderson Farabow, Garrett & Dunner, LLP

(57) ABSTRACT

A handheld electronic device includes a reduced QWERTY keyboard and is enabled with disambiguation software. The device provides output in the form of a default output and a number of variants. The output is based largely upon the frequency, i.e., the likelihood that a user intended a particular output, but various features of the device provide additional variants that are not based solely on frequency and rather are provided by various logic structures resident on the device. The device enables editing during text entry and also provides a learning function that allows the disambiguation function to adapt to provide a customized experience for the user. The disambiguation function can be selectively disabled and an alternate keystroke interpretation system provided.

20 Claims, 14 Drawing Sheets

U.S. PATENT DOCUMENTS

| | | | |
|---|---|---|---|
| 6,204,848 | B1 | 3/2001 | Nowlan et al. |
| 6,307,549 | B1 | 10/2001 | Grunbock et al. |
| 6,349,282 | B1 | 2/2002 | Van Aelten et al. |
| 6,580,932 | B1 | 6/2003 | Finke-Anlauff |
| 7,091,885 | B2 | 8/2006 | Fux et al. |
| 7,283,065 | B2 | 10/2007 | Scott et al. |
| 7,389,124 | B2 * | 6/2008 | Fux et al. .................. 455/550.1 |
| 7,403,188 | B2 * | 7/2008 | Fux et al. ...................... 345/168 |
| 2003/0112219 | A1 * | 6/2003 | Gharsalli et al. ............. 345/156 |
| 2004/0021691 | A1 | 2/2004 | Davis et al. |
| 2006/0007121 | A1 | 1/2006 | Fux et al. |
| 2006/0047244 | A1 | 3/2006 | Fux et al. |
| 2006/0221060 | A1 | 10/2006 | Fux et al. |

FOREIGN PATENT DOCUMENTS

| | | |
|---|---|---|
| EP | 1 296 216 A | 3/2003 |
| GB | 2 385 692 S | 8/2003 |
| WO | 98/08688 A | 3/1998 |
| WO | 98/33111 A | 7/1998 |

OTHER PUBLICATIONS

Examination Report in corresponding Great Britain Application No. GB0625978.2, mailed by the UK Intellectual Property Office on May 15, 2008 (2 pages).

First Office Action in corresponding Chinese Application No. 200580021824.6, mailed by the Chinese Patent Office on Nov. 28, 2008 (6 pages).

Second Office Action in corresponding Chinese Application No. 200580021824.6, mailed by the Chinese Patent Office on Jun. 5, 2009 (4 pages).

Third Office Action in corresponding Chinese Application No. 200580021824.6, mailed by the Chinese Patent Office on Sep. 11, 2009 (14 pages).

International Search Report and Written Opinion in corresponding PCT Application No. PCT/CA2005/000850 mailed by the Canadian Patent Office on Aug. 23, 2005 (8 pages).

International Preliminary Report on Patentability in corresponding PCT Application No. PCT/CA2005/000850 mailed by the Canadian Patent Office on Oct. 4, 2006 (4 pages).

European Search Report in corresponding European Application No. EP04253282.0 mailed by the European Patent Office on Nov. 17, 2004 (12 pages).

Communication in corresponding European Application No. 04253282.0 mailed by the European Patent Office on Aug. 22, 2006 (7 pages).

Communication in corresponding European Application No. 04253282.0 mailed by the European Patent Office on Jun. 24, 2008 (5 pages).

Summons to Attend Oral Proceedings in corresponding European Application No. 04253282.0 mailed by the European Patent Office on Mar. 11, 2010 (5 pages).

Decision to Refuse in corresponding European Application No. 04253282.0 mailed by the European Patent Office on Nov. 8, 2010 (7 pages).

Office Action in corresponding German Patent Application No. 11 2005 001 313.8-53 dated Jun. 10, 2008 (2 pages).

Office Action in corresponding German Patent Application No. 11 2005 001 313.8-53 mailed on Apr. 4, 2010 (2 pages).

Harbusch, K. et al., "Towards an Adaptive Communication Aid with Text Input from Ambiguous Keyboards," Proceedings of the 10th Conference of the European Chapter of the Association for Computational Linguistics (EACL 2003), Budapest, Hungary, 2003 (8 pages).

* cited by examiner

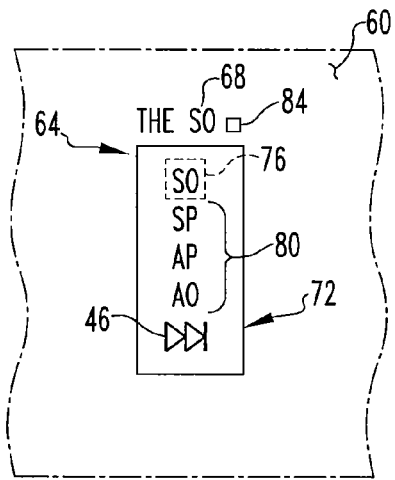
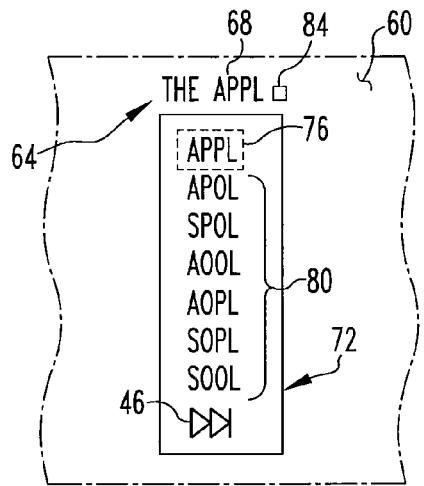
FIG.7  FIG.8
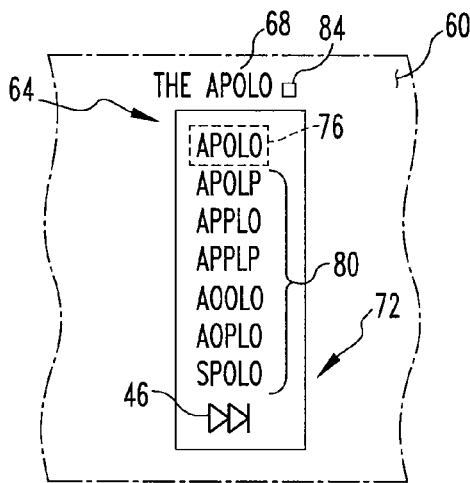
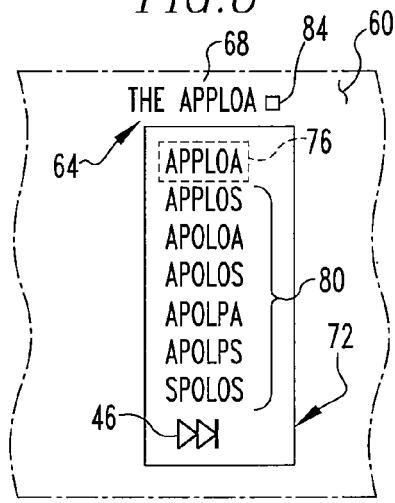
FIG.9  FIG.10
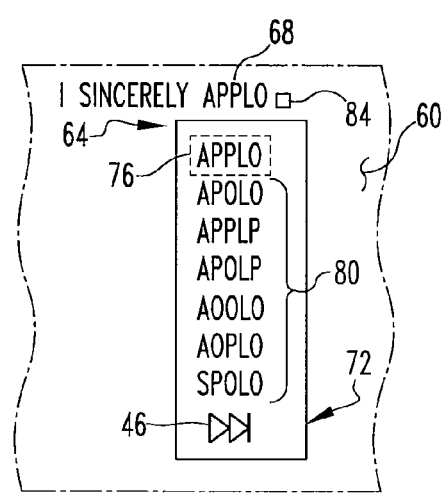
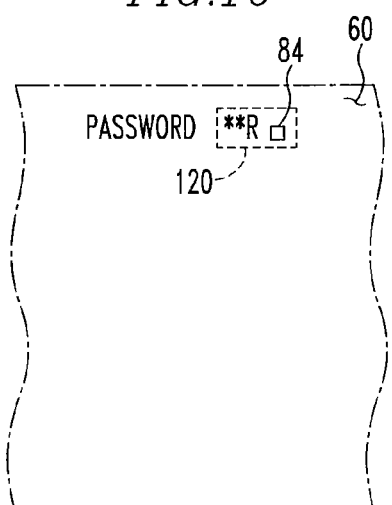
FIG.11  FIG.12

HANDHELD ELECTRONIC DEVICE AND ASSOCIATED METHOD EMPLOYING A MULTIPLE-AXIS INPUT DEVICE AND PROVIDING A LEARNING FUNCTION IN A TEXT DISAMBIGUATION ENVIRONMENT

CROSS-REFERENCE TO RELATED APPLICATION

This application claims priority from and claims the benefit of U.S. patent application Ser. No. 10/859,444 filed Jun. 2, 2004, the disclosures of which are incorporated herein by reference.

BACKGROUND

1. Field

The disclosed and claimed concept relates generally to handheld electronic devices and, more particularly, to a handheld electronic device having a reduced keyboard and an input disambiguation function, and also relates to an associated method.

2. Background Information

Numerous types of handheld electronic devices are known. Examples of such handheld electronic devices include, for instance, personal data assistants (PDAs), handheld computers, two-way pagers, cellular telephones, and the like. Many handheld electronic devices also feature wireless communication capability, although many such handheld electronic devices are stand-alone devices that are functional without communication with other devices.

Such handheld electronic devices are generally intended to be portable, and thus are of a relatively compact configuration in which keys and other input structures often perform multiple functions under certain circumstances or may otherwise have multiple aspects or features assigned thereto. With advances in technology, handheld electronic devices are built to have progressively smaller form factors yet have progressively greater numbers of applications and features resident thereon. As a practical matter, the keys of a keypad can only be reduced to a certain small size before the keys become relatively unusable. In order to enable text entry, however, a keypad must be capable of entering all twenty-six letters of the Latin alphabet, for instance, as well as appropriate punctuation and other symbols.

One way of providing numerous letters in a small space has been to provide a "reduced keyboard" in which multiple letters, symbols, and/or digits, and the like, are assigned to any given key. For example, a touch-tone telephone includes a reduced keypad by providing twelve keys, of which ten have digits thereon, and of these ten keys eight have Latin letters assigned thereto. For instance, one of the keys includes the digit "2" as well as the letters "A", "B", and "C". Other known reduced keyboards have included other arrangements of keys, letters, symbols, digits, and the like. Since a single actuation of such a key potentially could be intended by the user to refer to any of the letters "A", "B", and "C", and potentially could also be intended to refer to the digit "2", the input generally is an ambiguous input and is in need of some type of disambiguation in order to be useful for text entry purposes.

In order to enable a user to make use of the multiple letters, digits, and the like on any given key, numerous keystroke interpretation systems have been provided. For instance, a "multi-tap" system allows a user to substantially unambiguously specify a particular character on a key by pressing the same key a number of times equivalent to the position of the desired character on the key. For example, on the aforementioned telephone key that includes the letters "ABC", and the user desires to specify the letter "C", the user will press the key three times. While such multi-tap systems have been generally effective for their intended purposes, they nevertheless can require a relatively large number of key inputs compared with the number of characters that ultimately are output.

Another exemplary keystroke interpretation system would include key chording, of which various types exist. For instance, a particular character can be entered by pressing two keys in succession or by pressing and holding first key while pressing a second key. Still another exemplary keystroke interpretation system would be a "press-and-hold/press-and-release" interpretation function in which a given key provides a first result if the key is pressed and immediately released, and provides a second result if the key is pressed and held for a short period of time. While they systems have likewise been generally effective for their intended purposes, such systems also have their own unique drawbacks.

Another keystroke interpretation system that has been employed is a software-based text disambiguation function. In such a system, a user typically presses keys to which one or more characters have been assigned, generally pressing each key one time for each desired letter, and the disambiguation software attempt to predict the intended input. Numerous such systems have been proposed, and while many have been generally effective for their intended purposes, shortcomings still exist.

It would be desirable to provide an improved handheld electronic device with a reduced keyboard that seeks to mimic a QWERTY keyboard experience or other particular keyboard experience. Such an improved handheld electronic device might also desirably be configured with enough features to enable text entry and other tasks with relative ease.

BRIEF DESCRIPTION OF THE DRAWINGS

A full understanding of the disclosed and claimed concept can be gained from the following Description when read in conjunction with the accompanying drawings in which:

FIG. 7 is an exemplary output during a text entry operation;

FIG. 8 is another exemplary output during another part of the text entry operation;

FIG. 9 is another exemplary output during another part of the text entry operation;

FIG. 10 is another exemplary output during another part of the text entry operation;

FIG. 11 is an exemplary output on the handheld electronic device during another text entry operation; and FIG. 12 is an exemplary output that can be provided in an instance when the disambiguation function of the handheld electronic device has been disabled

Similar numerals refer to similar parts throughout the specification.

DESCRIPTION

Figure 1:
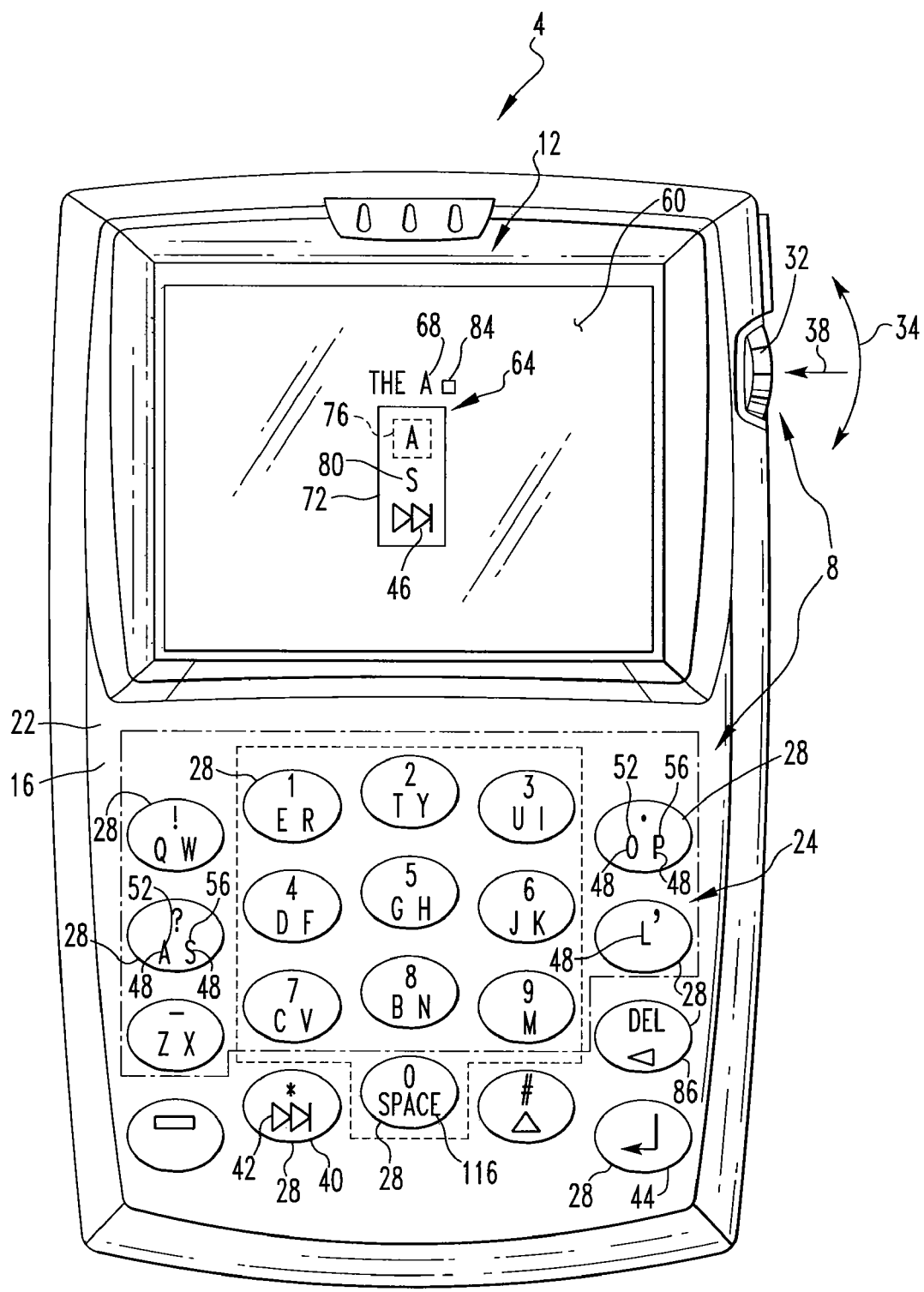
FIG. 1 is a top plan view of an improved handheld electronic device in accordance with the disclosed and claimed concept.
Figure 2:
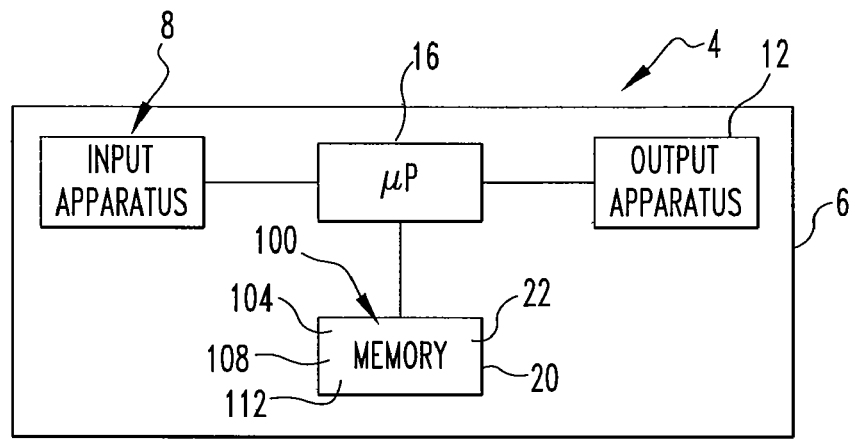
FIG. 2 is a schematic depiction of the improved handheld electronic device of FIG. 1.

An improved handheld electronic device 4 is indicated generally in FIG. 1 and is depicted schematically in FIG. 2. The exemplary handheld electronic device 4 includes a housing 6 upon which are disposed a processor unit that includes an input apparatus 8, an output apparatus 12, a processor 16, a memory 20, and at least a first routine. The processor and the memory 20 can be said to together form a processor apparatus. The processor 16 may be, for instance, and without limitation, a microprocessor (μP) and is responsive to inputs from the input apparatus 8 and provides output signals to the output apparatus 12. The processor 16 also interfaces with the memory 20. Examples of handheld electronic devices are included in U.S. Pat. Nos. 6,452,588 and 6,489,950, which are incorporated by reference herein.

As can be understood from FIG. 1, the input apparatus 8 includes a keypad 24 and a thumbwheel 32. As will be described in greater detail below, the keypad 24 is in the exemplary form of a reduced QWERTY keyboard including a plurality of keys 28 that serve as input members. It is noted, however, that the keypad 24 may be of other configurations, such as an AZERTY keyboard, a QWERTZ keyboard, or other keyboard arrangement, whether presently known or unknown, and either reduced or not reduced. In this regard, the expression "reduced" and variations thereof, in the context of a keyboard, a keypad, or other arrangement of input members, shall refer broadly to an arrangement in which at least one of the input members has assigned thereto a plurality of characters within a given set, such as a plurality of letters, for example, in the set of Latin letters, for example, thereby rendering ambiguous an intended result of an actuation of the at least one of the input members.

In this regard, and as will be set forth below in greater detail, the system architecture of the handheld electronic device 4 advantageously is organized to be operable independent of the specific layout of the keypad 24. Accordingly, the system architecture of the handheld electronic device 4 can be employed in conjunction with virtually any keypad layout substantially without requiring any meaningful change in the system architecture. It is further noted that certain of the features set forth herein are usable on either or both of a reduced keyboard and a non-reduced keyboard.

The keys 28 are disposed on a front face of the housing 6, and the thumbwheel 32 is disposed at a side of the housing 6. The thumbwheel 32 can serve as another input member and is both rotatable, as is indicated by the arrow 34, to provide selection inputs to the processor 16, and also can be pressed in a direction generally toward the housing 6, as is indicated by the arrow 38, to provide another selection input to the processor 16.

Among the keys 28 of the keypad 24 are a <NEXT> key 40 and an <ENTER> key 44. The <NEXT> key 40 can be pressed to provide a selection input to the processor 16 and provides substantially the same selection input as is provided by a rotational input of the thumbwheel 32. Since the <NEXT> key 40 is provided adjacent a number of the other keys 28 of the keypad 24, the user can provide a selection input to the processor 16 substantially without moving the user's hands away from the keypad 24 during a text entry operation. As will be described in greater detail below, the <NEXT> key 40 additionally and advantageously includes a graphic 42 disposed thereon, and in certain circumstances the output apparatus 12 also displays a displayed graphic 46 thereon to identify the <NEXT> key 40 as being able to provide a selection input to the processor 16. In this regard, the displayed graphic 46 of the output apparatus 12 is substantially similar to the graphic 42 on the <NEXT> key and thus identifies the <NEXT> key 40 as being capable of providing a desirable selection input to the processor 16.

As can further be seen in FIG. 1, many of the keys 28 include a number of characters 48 disposed thereon. As employed herein, the expression "a number of" and variations thereof shall refer broadly to any quantity, including a quantity of one, and in certain circumstances herein can also refer to a quantity of zero. In the exemplary depiction of the keypad 24, many of the keys 28 include two characters, such as including a first character 52 and a second character 56 assigned thereto. It is understood that the expression "characters" shall broadly be construed to include letters, digits, symbols and the like and can additionally include ideographic characters, components thereof, and the like.

One of the keys 28 of the keypad 24 includes as the characters 48 thereof the letters "Q" and "W", and an adjacent key 28 includes as the characters 48 thereof the letters "E" and "R". It can be seen that the arrangement of the characters 48 on the keys 28 of the keypad 24 is generally of a QWERTY arrangement, albeit with many of the keys 28 including two of the characters 48.

The output apparatus 12 includes a display 60 upon which can be provided an output 64. An exemplary output 64 is depicted on the display 60 in FIG. 1. The output 64 includes a text component 68 and a variant component 72. The variant component 72 includes a default portion 76 and a variant portion 80. The display also includes a caret 84 that depicts generally where the next input from the input apparatus 8 will be received.

The text component 68 of the output 64 provides a depiction of the default portion 76 of the output 64 at a location on the display 60 where the text is being input. The variant component 72 is disposed generally in the vicinity of the text component 68 and provides, in addition to the default proposed output 76, a depiction of the various alternate text choices, i.e., alternates to the default proposed output 76, that are proposed by an input disambiguation function in response to an input sequence of key actuations of the keys 28.

As will be described in greater detail below, the default portion 76 is proposed by the disambiguation function as being the most likely disambiguated interpretation of the ambiguous input provided by the user. The variant portion 80 includes a predetermined quantity of alternate proposed interpretations of the same ambiguous input from which the user can select, if desired. The displayed graphic 46 typically is provided in the variant component 72 in the vicinity of the variant portion 80, although it is understood that the displayed graphic 46 could be provided in other locations and in other fashions without departing from the disclosed and claimed concept. It is also noted that the exemplary variant portion 80 is depicted herein as extending vertically below the default portion 76, but it is understood that numerous other arrangements could be provided without departing from the disclosed and claimed concept.

Among the keys 28 of the keypad 24 additionally is a <DELETE> key 86 that can be provided to delete a text entry. As will be described in greater detail below, the <DELETE> key 86 can also be employed in providing an alternation input to the processor 16 for use by the disambiguation function.

Figure 2A:
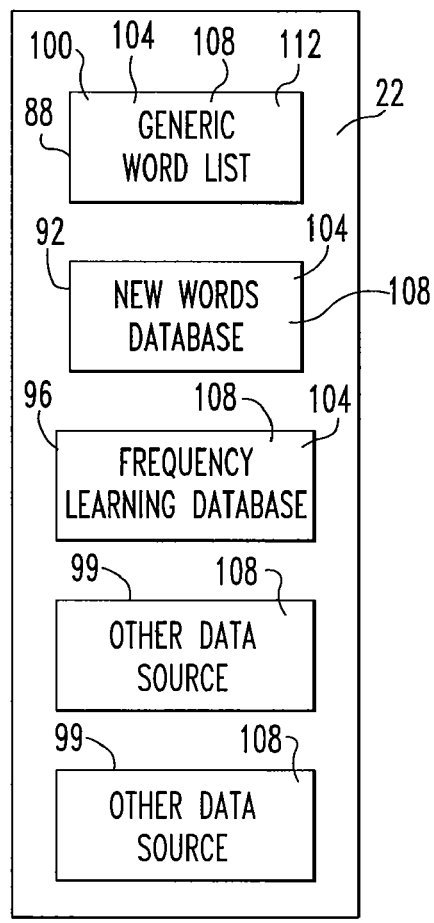
FIG. 2a is a schematic depiction of a portion of the handheld electronic device of FIG. 2.

The memory 20 is depicted schematically in FIG. 2A. The memory 20 can be said to constitute a machine-readable medium and can be any of a variety of types of internal and/or external storage media such as, without limitation, RAM, ROM, EPROM(s), EEPROM(s), and the like that provide a storage register for data storage such as in the fashion of an internal storage area of a computer, and can be volatile memory or nonvolatile memory. The memory 20 additionally includes a number of routines depicted generally with the numeral 22 for the processing of data. The routines 22 can be in any of a variety of forms such as, without limitation, software, firmware, and the like. As will be explained in greater detail below, the routines 22 include the aforementioned disambiguation function as an application, as well as other routines.

As can be understood from FIG. 2A, the memory 20 additionally includes data stored and/or organized in a number of tables, sets, lists, and/or otherwise. Specifically, the memory 20 includes a generic word list 88, a new words database 92, and a frequency learning database 96. Stored within the various areas of the memory 20 are a number of language objects 100 and frequency objects 104. The language objects 100 generally are each associated with an associated frequency object 104. The language objects 100 include a plurality of word objects 108 and a plurality of N-gram objects 112. The word objects 108 are generally representative of complete words within the language or custom words stored in the memory 20. For instance, if the language stored in the memory is, for example, English, generally each word object 108 would represent a word in the English language or would represent a custom word.

Associated with substantially each word object 108 is a frequency object 104 having frequency value that is indicative of the relative frequency within the relevant language of the given word represented by the word object 108. In this regard, the generic word list 88 includes a corpus of word objects 108 and associated frequency objects 104 that together are representative of a wide variety of words and their relative frequency within a given vernacular of, for instance, a given language. The generic word list 88 can be derived in any of a wide variety of fashions, such as by analyzing numerous texts and other language sources to determine the various words within the language sources as well as their relative probabilities, i.e., relative frequencies, of occurrences of the various words within the language sources.

The N-gram objects 112 stored within the generic word list 88 are short strings of characters within the relevant language typically, for example, one to three characters in length, and typically represent word fragments within the relevant language, although certain of the N-gram objects 112 additionally can themselves be words. However, to the extent that an N-gram object 112 also is a word within the relevant language, the same word likely would be separately stored as a word object 108 within the generic word list 88. As employed herein, the expression "string" and variations thereof shall refer broadly to an object having one or more characters or components, and can refer to any of a complete word, a fragment of a word, a custom word or expression, and the like.

In the present exemplary embodiment of the handheld electronic device 4, the N-gram objects 112 include 1-gram objects, i.e., string objects that are one character in length, 2-gram objects, i.e., string objects that are two characters in length, and 3-gram objects, i.e., string objects that are three characters in length, all of which are collectively referred to as N-grams 112. Substantially each N-gram object 112 in the generic word list 88 is similarly associated with an associated frequency object 104 stored within the generic word list 88, but the frequency object 104 associated with a given N-gram object 112 has a frequency value that indicates the relative probability that the character string represented by the particular N-gram object 112 exists at any location within any word of the relevant language. The N-gram objects 112 and the associated frequency objects 104 are a part of the corpus of the generic word list 88 and are obtained in a fashion similar to the way in which the word object 108 and the associated frequency objects 104 are obtained, although the analysis performed in obtaining the N-gram objects 112 will be slightly different because it will involve analysis of the various character strings within the various words instead of relying primarily on the relative occurrence of a given word.

The present exemplary embodiment of the handheld electronic device 4, with its exemplary language being the English language, includes twenty-six 1-gram N-gram objects 112, i.e., one 1-gram object for each of the twenty-six letters in the Latin alphabet upon which the English language is based, and further includes 676 2-gram N-gram objects 112, i.e., twenty-six squared, representing each two-letter permutation of the twenty-six letters within the Latin alphabet.

The N-gram objects 112 also include a certain quantity of 3-gram N-gram objects 112, primarily those that have a relatively high frequency within the relevant language. The exemplary embodiment of the handheld electronic device 4 includes fewer than all of the three-letter permutations of the twenty-six letters of the Latin alphabet due to considerations of data storage size, and also because the 2-gram N-gram objects 112 can already provide a meaningful amount of information regarding the relevant language. As will be set forth in greater detail below, the N-gram objects 112 and their associated frequency objects 104 provide frequency data that can be attributed to character strings for which a corresponding word object 108 cannot be identified or has not been identified, and typically is employed as a fallback data source, although this need not be exclusively the case.

In the present exemplary embodiment, the language objects 100 and the frequency objects 104 are maintained substantially inviolate in the generic word list 88, meaning that the basic language corpus remains substantially unaltered within the generic word list 88, and the learning functions that are provided by the handheld electronic device 4 and that are described below operate in conjunction with other object that are generally stored elsewhere in memory 20, such as, for example, in the new words database 92 and the frequency learning database 96.

The new words database 92 and the frequency learning database 96 store additional word objects 108 and associated frequency objects 104 in order to provide to a user a customized experience in which words and the like that are used relatively more frequently by a user will be associated with relatively higher frequency values than might otherwise be reflected in the generic word list 88. More particularly, the new words database 92 includes word objects 108 that are user-defined and that generally are not found among the word objects 108 of the generic word list 88. Each word object 108 in the new words database 92 has associated therewith an associated frequency object 104 that is also stored in the new words database 92. The frequency learning database 96 stores word objects 108 and associated frequency objects 104 that are indicative of relatively more frequent usage of such words by a user than would be reflected in the generic word list 88. As such, the new words database 92 and the frequency learning database 96 provide two learning functions, that is, they together provide the ability to learn new words as well the ability to learn altered frequency values for known words.

Figure 3A:
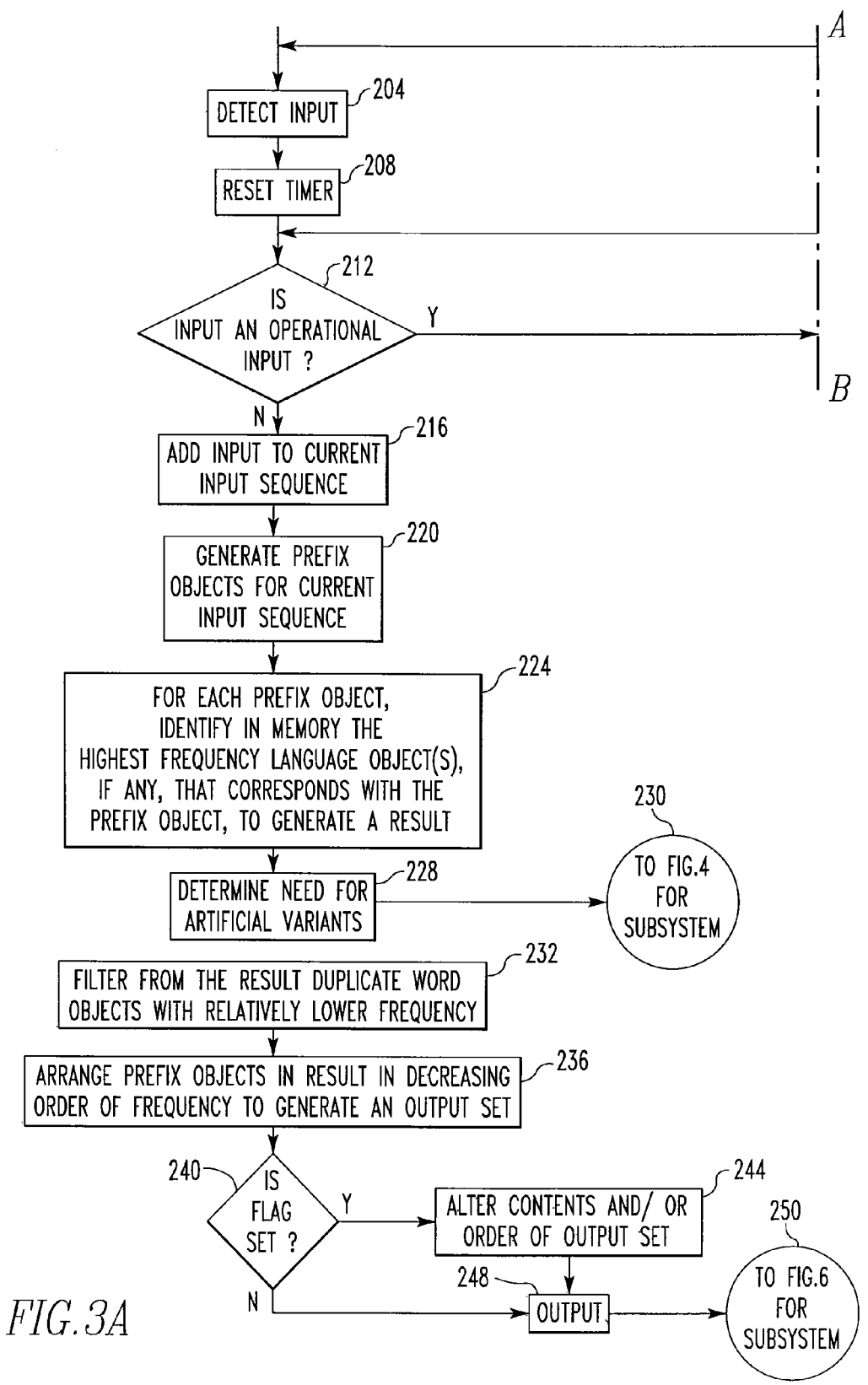
FIGS. 3a and 3b are an exemplary flowchart depicting certain aspects of a disambiguation function that can be executed on the handheld electronic device of FIG. 1.
Figure 3B:
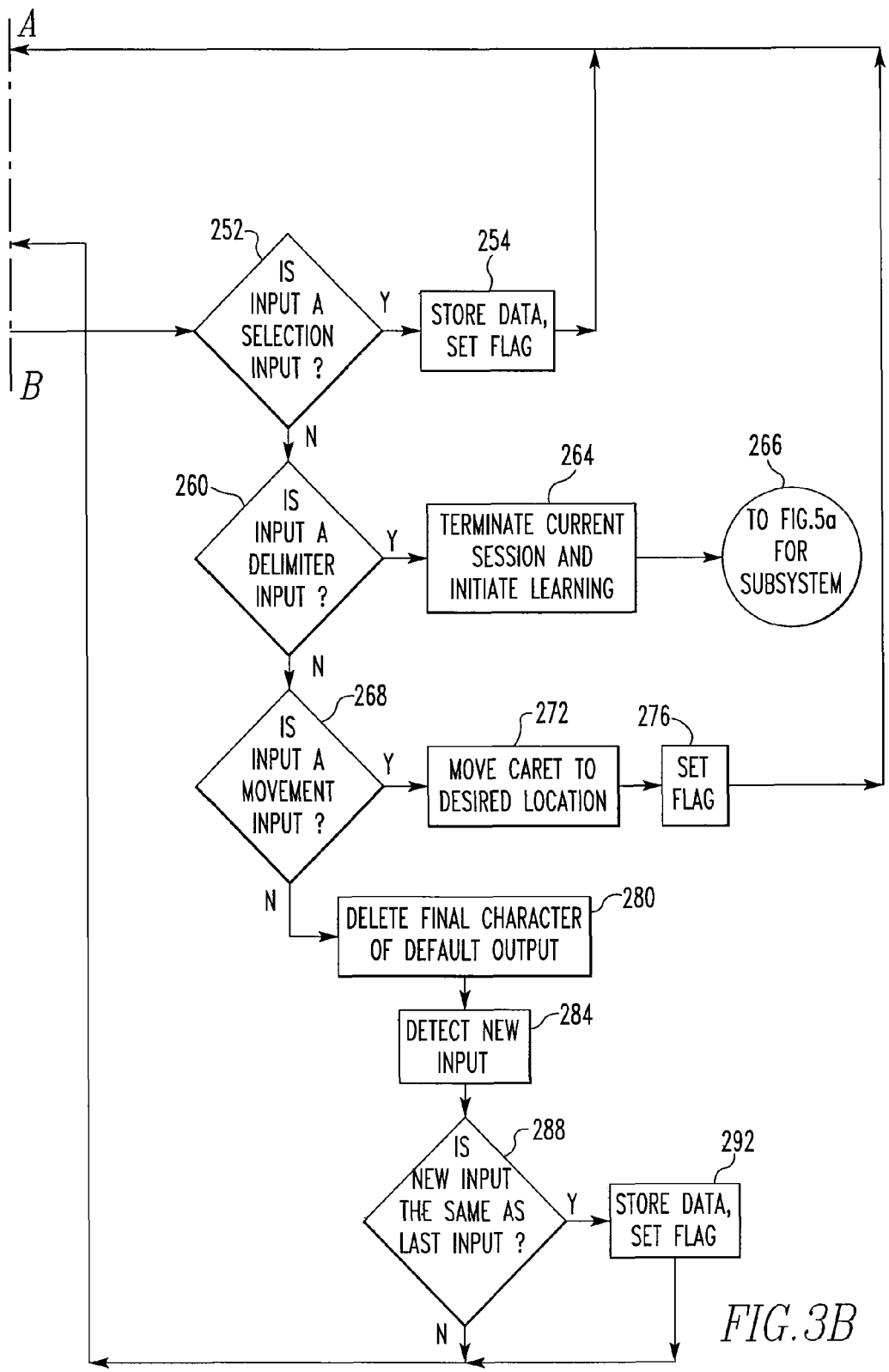

FIGS. 3*a* and 3*b* depicts in an exemplary fashion the general operation of certain aspects of the disambiguation function of the handheld electronic device 4. Additional features, functions, and the like are depicted and described elsewhere.

An input is detected, as at 204, and the input can be any type of actuation or other operation as to any portion of the input apparatus 8. A typical input would include, for instance, an actuation of a key 28 having a number of characters 48 thereon, or any other type of actuation or manipulation of the input apparatus 8.

Upon detection at 204 of an input, a timer is reset at 208. The use of the timer will be described in greater detail below.

The disambiguation function then determines, as at 212, whether the current input is an operational input, such as a selection input, a delimiter input, a movement input, an alternation input, or, for instance, any other input that does not constitute an actuation of a key 28 having a number of characters 48 thereon. If the input is determined at 212 to not be an operational input, processing continues at 216 by adding the input to the current input sequence which may or may not already include an input.

Many of the inputs detected at 204 are employed in generating input sequences as to which the disambiguation function will be executed. An input sequence is build up in each "session" with each actuation of a key 28 having a number of characters 48 thereon. Since an input sequence typically will be made up of at least one actuation of a key 28 having a plurality of characters 48 thereon, the input sequence will be ambiguous. When a word, for example, is completed the current session is ended and a new session is initiated.

An input sequence is gradually built up on the handheld electronic device 4 with each successive actuation of a key 28 during any given session. Specifically, once a delimiter input is detected during any given session, the session is terminated and a new session is initiated. Each input resulting from an actuation of one of the keys 28 having a number of the characters 48 associated therewith is sequentially added to the current input sequence. As the input sequence grows during a given session, the disambiguation function generally is executed with each actuation of a key 28, i.e., and input, and as to the entire input sequence. Stated otherwise, within a given session, the growing input sequence is attempted to be disambiguated as a unit by the disambiguation function with each successive actuation of the various keys 28.

Once a current input representing a most recent actuation of the one of the keys 28 having a number of the characters 48 assigned thereto has been added to the current input sequence within the current session, as at 216 in FIG. 3*a*, the disambiguation function generates, as at 220, substantially all of the permutations of the characters 48 assigned to the various keys 28 that were actuated in generating the input sequence. In this regard, the "permutations" refer to the various strings that can result from the characters 48 of each actuated key 28 limited by the order in which the keys 28 were actuated. The various permutations of the characters in the input sequence are employed as prefix objects.

For instance, if the current input sequence within the current session is the ambiguous input of the keys "AS" and "OP", the various permutations of the first character 52 and the second character 56 of each of the two keys 28, when considered in the sequence in which the keys 28 were actuated, would be "SO", "SP", "AP", and "AO", and each of these is a prefix object that is generated, as at 220, with respect to the current input sequence. As will be explained in greater detail below, the disambiguation function seeks to identify for each prefix object one of the word objects 108 for which the prefix object would be a prefix.

For each generated prefix object, the memory 20 is consulted, as at 224, to identify, if possible, for each prefix object one of the word objects 108 in the memory 20 that corresponds with the prefix object, meaning that the sequence of letters represented by the prefix object would be either a prefix of the identified word object 108 or would be substantially identical to the entirety of the word object 108. Further in this regard, the word object 108 that is sought to be identified is the highest frequency word object 108. That is, the disambiguation function seeks to identify the word object 108 that corresponds with the prefix object and that also is associated with a frequency object 104 having a relatively higher frequency value than any of the other frequency objects 104 associated with the other word objects 108 that correspond with the prefix object.

It is noted in this regard that the word objects 108 in the generic word list 88 are generally organized in data tables that correspond with the first two letters of various words. For instance, the data table associated with the prefix "CO" would include all of the words such as "CODE", "COIN", "COMMUNICATION", and the like. Depending upon the quantity of word objects 108 within any given data table, the data table may additionally include sub-data tables within which word objects 108 are organized by prefixes that are three characters or more in length. Continuing onward with the foregoing example, if the "CO" data table included, for instance, more than 256 word objects 108, the "CO" data table would additionally include one or more sub-data tables of word objects 108 corresponding with the most frequently appearing three-letter prefixes. By way of example, therefore, the "CO" data table may also include a "COM" sub-data table and a "CON" sub-data table. If a sub-data table includes more than the predetermined number of word objects 108, for example a quantity of 256, the sub-data table may include further sub-data tables, such as might be organized according to a four letter prefixes. It is noted that the aforementioned quantity of 256 of the word objects 108 corresponds with the greatest numerical value that can be stored within one byte of the memory 20.

Accordingly, when, at 224, each prefix object is sought to be used to identify a corresponding word object 108, and for instance the instant prefix object is "AP", the "AP" data table will be consulted. Since all of the word objects 108 in the "AP" data table will correspond with the prefix object "AP", the word object 108 in the "AP" data table with which is associated a frequency object 104 having a frequency value relatively higher than any of the other frequency objects 104 in the "AP" data table is identified. The identified word object 108 and the associated frequency object 104 are then stored in a result register that serves as a result of the various comparisons of the generated prefix objects with the contents of the memory 20.

It is noted that one or more, or possibly all, of the prefix objects will be prefix objects for which a corresponding word object 108 is not identified in the memory 20. Such prefix objects are considered to be orphan prefix objects and are separately stored or are otherwise retained for possible future use. In this regard, it is noted that many or all of the prefix objects can become orphan object if, for instance, the user is trying to enter a new word or, for example, if the user has mis-keyed and no word corresponds with the mis-keyed input.

Once the result has been obtained at 224, the disambiguation function determines, as at 228, whether artificial variants should be generated. In order to determine the need for artificial variants, the process at 228 branches, as at 230, to the artificial variant process depicted generally in FIG. 4 and beginning with the numeral 304. The disambiguation function then determines, as at 308, whether any of the prefix objects in the result correspond with what had been the default output 76 prior to detection of the current key input. If a prefix object in the result corresponds with the previous default output, this means that the current input sequence corresponds with a word object 108 and, necessarily, the previous default output also corresponded with a word object 108 during the previous disambiguation cycle within the current session.

The next point of analysis is to determine, as at 310, whether the previous default output was made the default output because of a selection input, such as would have caused the setting of a flag, such as at 254 of FIG. 3b, discussed in greater detail below. In the event that the previous default output was not the result of a selection input, no artificial variants are needed, and the process returns, as at 312, to the main process at 232. However, if it is determined at 310 that the previous default output was the result of a selection input, then artificial variants are generated, as at 316.

More specifically, each of the artificial variants generated at 316 include the previous default output plus one of the characters 48 assigned to the key 28 of the current input. As such, if the key 28 of the current input has two characters, i.e., a first character 52 and a second character 56, two artificial variants will be generated at 316. One of the artificial variants will include the previous default output plus the first character 52. The other artificial variant will include the previous default output plus the second character 56.

However, if it is determined at 308 that none of the prefix objects in the result correspond with the previous default output, it is next necessary to determine, as at 314, whether the previous default output had corresponded with a word object 108 during the previous disambiguation cycle within the current session. If the answer to the inquiry at 314 is no, it is still necessary to determine, as at 318, whether the previous default output was made the default output because of a selection input, such as would have causes the setting of the flag. In the event that the previous default output was not the result of a selection input, no artificial variants are needed, and the process returns, as at 312, to the main process at 232. However, if it is determined at 318 that the previous default output was the result of a selection input, then artificial variants are generated, as at 316.

On the other hand, if it is determined that the answer to the inquiry at 314 is yes, meaning that the previous default output had corresponded with a word object, but with the current input the previous default output combined with the current input has ceased to correspond with any word object 108, then artificial variants are generated, again as at 316.

After the artificial variants are generated at 316, the method then determines, as at 320, whether the result includes any prefix objects at all. If not, processing returns, as at 312, to the main process at 232. However, if it is determined at 320 that the result includes at least a first prefix object, meaning that the current input sequence corresponds with a word object 108, processing is transferred to 324 where an additional artificial variant is created. Specifically, the prefix object of the result with which is associated the frequency object 104 having the relatively highest frequency value among the other frequency objects 104 in the result is identified, and the artificial variant is created by deleting the final character from the identified prefix object and replacing it with an opposite character 48 on the same key 28 of the current input that generated the final character 48 of the identified prefix object. In the event that the specific key 28 has more than two characters 48 assigned thereto, each such opposite character 48 will be used to generate an additional artificial variant.

Figure 4:
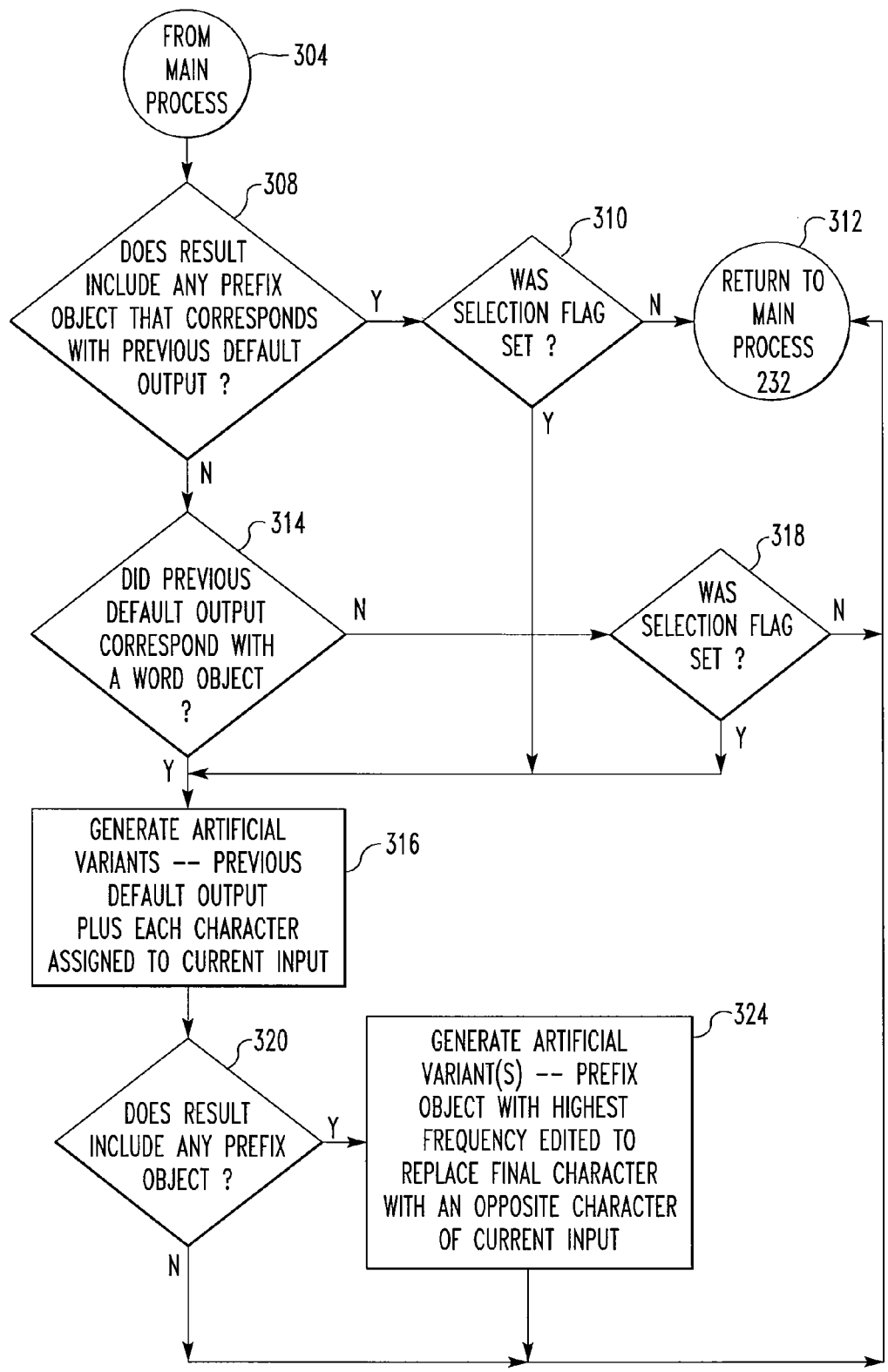
FIG. 4 is another exemplary flowchart depicting certain aspects of a disambiguation function that can be executed on the handheld electronic device by which certain output variants can be provided to the user.

Once the need for artificial variants has been identified, as at 228, and such artificial variants have been generated, as in FIG. 4 and as described above, processing continues, as at 232, where duplicate word objects 108 associated with relatively lower frequency values are deleted from the result. Such a duplicate word object 108 could be generated, for instance, by the frequency learning database 96, as will be set forth in greater detail below. If a word object 108 in the result matches one of the artificial variants, the word object 108 and its associated frequency object 104 generally will be removed from the result because the artificial variant will be assigned a preferred status in the output 64, likely in a position preferred to any word object 108 that might have been identified.

Once the duplicate word objects 108 and the associated frequency objects 104 have been removed at 232, the remaining prefix objects are arranged, as at 236, in an output set in decreasing order of frequency value. The orphan prefix objects mentioned above may also be added to the output set, albeit at positions of relatively lower frequency value than any prefix object for which a corresponding word object 108 was found. It is also necessary to ensure that the artificial variants, if they have been created, are placed at a preferred position in the output set. It is understood that artificial variants may, but need not necessarily be, given a position of preference, i.e., assigned a relatively higher priority or frequency, than prefix objects of the result.

If it is determined, as at 240, that the flag has been set, meaning that a user has made a selection input, either through an express selection input or through an alternation input of a movement input, then the default output 76 is considered to be "locked," meaning that the selected variant will be the default prefix until the end of the session. If it is determined at 240 that the flag has been set, the processing will proceed to 244 where the contents of the output set will be altered, if needed, to provide as the default output 76 an output that includes the selected prefix object, whether it corresponds with a word object 108 or is an artificial variant. In this regard, it is understood that the flag can be set additional times during a session, in which case the selected prefix associated with resetting of the flag thereafter becomes the "locked" default output 76 until the end of the session or until another selection input is detected.

Processing then continues, as at 248, to an output step after which an output 64 is generated as described above. More specifically, processing proceeds, as at 250, to the subsystem depicted generally in FIG. 6 and described below. Processing thereafter continues at 204 where additional input is detected. On the other hand, if it is determined at 240 that the flag had not been set, then processing goes directly to 248 without the alteration of the contents of the output set at 244.

The handheld electronic device 4 may be configured such that any orphan prefix object that is included in an output 64 but that is not selected with the next input is suspended. This may be limited to orphan prefix objects appearing in the variant portion 80 or may apply to orphan prefix objects anywhere in the output 64. The handheld electronic device 4 may also be configured to similarly suspend artificial variants in similar circumstances. A reason for such suspension is that each such orphan prefix object and/or artificial variant, as appropriate, may spawn a quantity of offspring orphan prefix objects equal to the quantity of characters 48 on a key 28 of the next input. That is, each offspring will include the parent orphan prefix object or artificial variant plus one of the characters 48 of the key 28 of the next input. Since orphan prefix objects and artificial variants substantially do not have correspondence with a word object 108, spawned offspring objects from parent orphan prefix objects and artificial variants likewise will not have correspondence with a word object 108. Such suspended orphan prefix objects and/or artificial variants may be considered to be suspended, as compared with being wholly eliminated, since such suspended orphan prefix objects and/or artificial variants may reappear later as parents of a spawned orphan prefix objects and/or artificial variants, as will be explained below.

If the detected input is determined, as at 212, to be an operational input, processing then continues to determine the specific nature of the operational input. For instance, if it is determined, as at 252, that the current input is a selection input, processing continues at 254. At 254, the word object 108 and the associated frequency object 104 of the default portion 76 of the output 64, as well as the word object 108 and the associated frequency object 104 of the portion of the variant output 80 that was selected by the selection input, are stored in a temporary learning data register. Additionally, the flag is set. Processing then returns to detection of additional inputs as at 204.

Figure 5A:
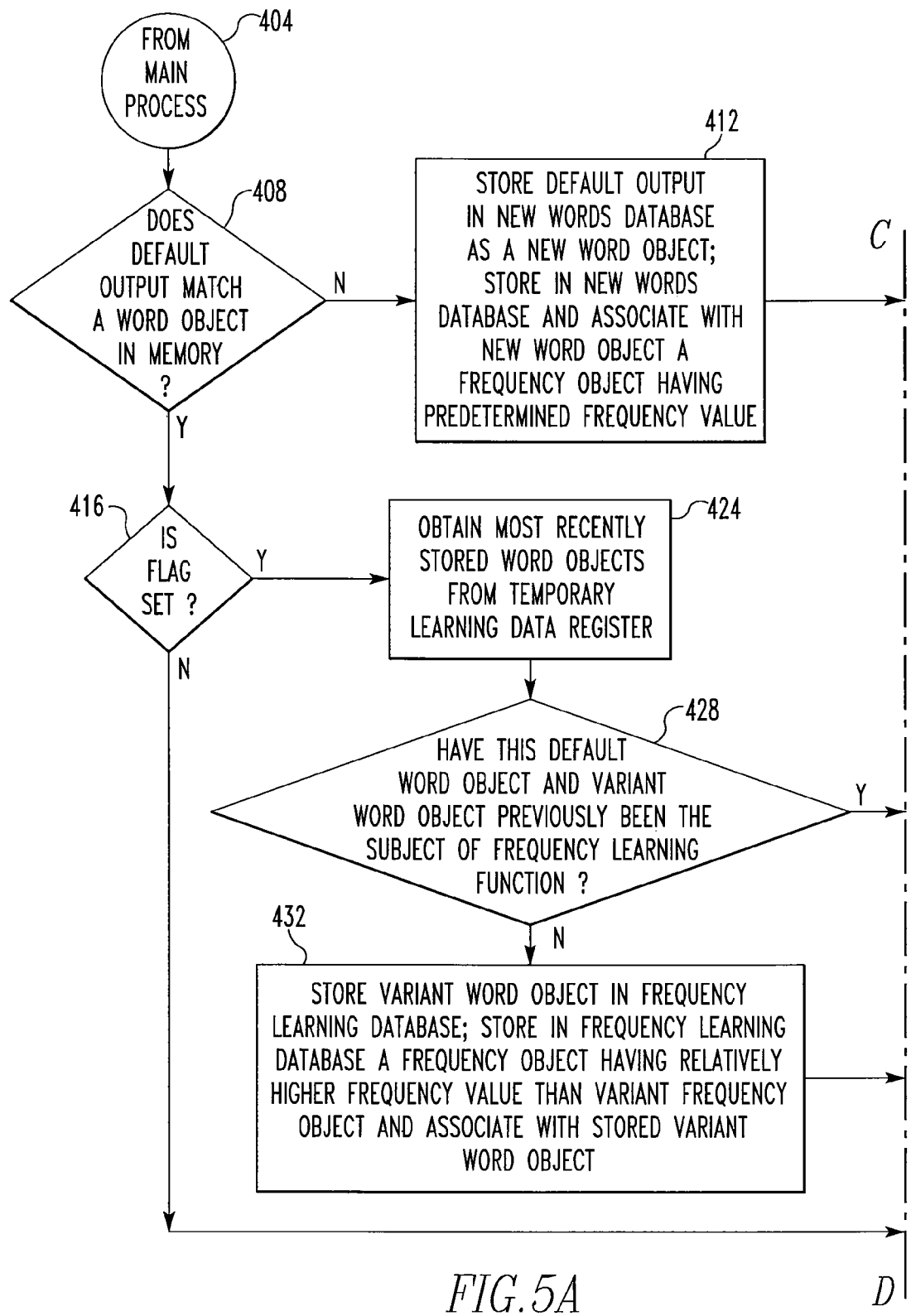
FIGS. 5a and 5b are another exemplary flowchart depicting certain aspects of the learning method that can be executed on the handheld electronic device.

If it is determined, as at 260, that the input is a delimiter input, processing continues at 264 where the current session is terminated and processing is transferred, as at 266, to the learning function subsystem, as at 404 of FIG. 5*a*. Such a delimiter input would be input by the user upon a completion of an intended word, i.e., the delimited input would indicate to the handheld electronic device 4 that the inputting of the particular desired word of the current session has been completed. A delimiter input would include, for example, the actuation of a <SPACE> key 116, which would both enter a delimiter symbol and would add a space at the end of the word, actuation of the <ENTER> key 44, which might similarly enter a delimiter input and enter a space, and by a translation of the thumbwheel 32, such as is indicated by the arrow 38, which might enter a delimiter input without additionally entering a space.

It is first determined, as at 408, whether the default output at the time of the detection of the delimiter input at 260 matches a word object 108 in the memory 20. If it does not, this means that the default output is a user-created output that should be added to the new words database 92 for future use. In such a circumstance processing then proceeds to 412 where the default output is stored in the new words database 92 as a new word object 108. Additionally, a frequency object 104 is stored in the new words database 92 and is associated with the aforementioned new word object 108. The new frequency object 104 is given a relatively high frequency value, typically within the upper one-fourth or one-third of a predetermined range of possible frequency values.

In this regard, frequency objects 104 are given an absolute frequency value generally in the range of zero to 65,535. The maximum value represents the largest number that can be stored within two bytes of the memory 20. The new frequency object 104 that is stored in the new words database 92 is assigned an absolute frequency value within the upper one-fourth or one-third of this range, particularly since the new word was used by a user and is likely to be used again.

With further regard to frequency object 104, it is noted that within a given data table, such as the "CO" data table mentioned above, the absolute frequency value is stored only for the frequency object 104 having the highest frequency value within the data table. All of the other frequency objects 104 in the same data table have frequency values stored as percentage values normalized to the aforementioned maximum absolute frequency value. That is, after identification of the frequency object 104 having the highest frequency value within a given data table, all of the other frequency objects 104 in the same data table are assigned a percentage of the absolute maximum value, which represents the ratio of the relatively smaller absolute frequency value of a particular frequency object 104 to the absolute frequency value of the aforementioned highest value frequency object 104. Advantageously, such percentage values can be stored within a single byte of memory, thus saving storage space within the handheld electronic device 4.

Upon creation of the new word object 108 and the new frequency object 104, and storage thereof within the new words database 92, processing is transferred to 420 where the learning process is terminated. Processing is then returned to the main process, as at 204.

If at 408 it is determined that the word object 108 in the default output 76 matches a word object 108 within the memory 20, processing then continues at 416 where it is determined whether the aforementioned flag has been set, such as occurs upon the detection of a selection input, and alternation input, or a movement input, by way of example. If it turns out that the flag has not been set, this means that the user has not expressed a preference for a variant prefix object over a default prefix object, and no need for frequency learning has arisen. In such a circumstance, processing continues at 420 where the learning process is terminated. Processing then returns to the main process at 204.

However, if it is determined at 416 that the flag has been set, the processor 16 retrieves from the temporary learning data register the most recently saved default and variant word objects 108, along with their associated frequency objects 104. It is then determined, as at 428, whether the default and variant word objects 108 had previously been subject of a frequency learning operation. This might be determined, for instance, by determining whether the variant word object 108 and the associated frequency object 104 were obtained from the frequency learning database 96. If the default and variant word objects 108 had not previously been the subject of a frequency learning operation, processing continues, as at 432, where the variant word object 108 is stored in the frequency learning database 96, and a revised frequency object 104 is generated having a frequency value greater than that of the frequency object 104 that previously had been associated with the variant word object 108. In the present exemplary circumstance, i.e., where the default word object 108 and the variant word object 108 are experiencing their first frequency learning operation, the revised frequency object 104 may, for instance, be given a frequency value equal to the sum of the frequency value of the frequency object 104 previously associated with the variant word object 108 plus one-half the difference between the frequency value of the frequency object 104 associated with the default word object 108 and the frequency value of the frequency object 104 previously associated with the variant word object 108. Upon storing the variant word object 108 and the revised frequency object 104 in the frequency learning database 96, processing continues at 420 where the learning process is terminated and processing returns to the main process, as at 204.

If it is determined at 428 that that default word object 108 and the variant word object 108 had previously been the subject of a frequency learning operation, processing continues to 436 where the revised frequency value 104 is instead given a frequency value higher than the frequency value of the frequency object 104 associated with the default word object 108. After storage of the variant word object 108 and the revised frequency object 104 in the frequency learning database 96, processing continues to 420 where the learning process is terminated, and processing then returns to the main process, as at 204.

With further regard to the learning function, it is noted that the learning function additionally detects whether both the default word object 108 and the variant word object 104 were obtained from the frequency learning database 96. In this regard, when word objects 108 are identified, as at 224, for correspondence with generated prefix objects, all of the data sources in the memory are polled for such corresponding word objects 108 and corresponding frequency objects 104. Since the frequency learning database 96 stores word objects 108 that also are stored either in the generic word list 88 or the new words database 92, the word object 108 and the associated frequency object 104 that are obtained from the frequency learning database 96 typically are duplicates of word objects 108 that have already been obtained from the generic word list 88 or the new words database 92. However, the associated frequency object 104 obtained from the frequency learning database 96 typically has a frequency value that is of a greater magnitude than that of the associated frequency object 104 that had been obtained from the generic word list 88. This reflects the nature of the frequency learning database 96 as imparting to a frequently used word object 108 a relatively greater frequency value than it otherwise would have in the generic word list 88.

Figure 5B:
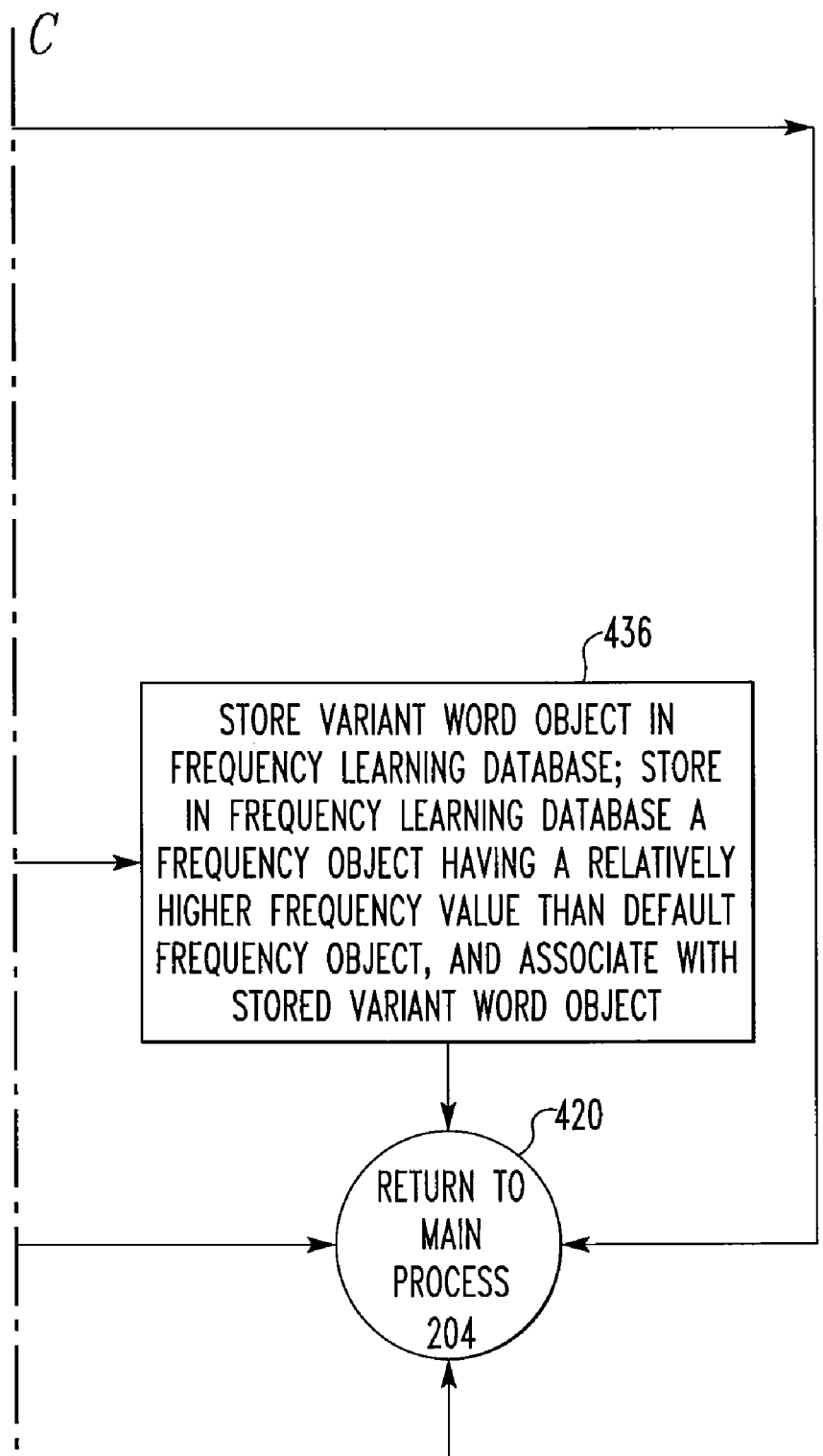

It thus can be seen that the learning function indicated in FIGS. 5a and 5b and described above is generally not initiated until a delimiter input is detected, meaning that learning occurs only once for each session. Additionally, if the final default output is not a user-defined new word, the word objects 108 that are the subject of the frequency learning function are the word objects 108 which were associated with the default output 76 and the selected variant output 80 at the time when the selection occurred, rather than necessarily being related to the object that ultimately resulted as the default output at the end of the session. Also, if numerous learnable events occurred during a single session, the frequency learning function operates only on the word objects 108 that were associated with the final learnable event, i.e., a selection event, an alternation event, or a movement event, prior to termination of the current session.

With further regard to the identification of various word objects 108 for correspondence with generated prefix objects, it is noted that the memory 20 can include a number of additional data sources 99 in addition to the generic word list 88, the new words database 92, and the frequency learning database 96, all of which can be considered linguistic sources. An exemplary two other data sources 99 are depicted in FIG. 2a, it being understood that the memory 20 might include any number of other data sources 99. The other data sources 99 might include, for example, an address database, a speed-text database, or any other data source without limitation. An exemplary speed-text database might include, for example, sets of words or expressions or other data that are each associated with, for example, a character string that may be abbreviated. For example, a speed-text database might associate the string "br" with the set of words "Best Regards", with the intention that a user can type the string "br" and receive the output "Best Regards".

In seeking to identify word objects 108 that correspond with a given prefix object, the handheld electronic device 4 may poll all of the data sources in the memory 20. For instance the handheld electronic device 4 may poll the generic word list 88, the new words database 92, the frequency learning database 96, and the other data sources 99 to identify word objects 108 that correspond with the prefix object. The contents of the other data sources 99 may be treated as word objects 108, and the processor 20 may generate frequency objects 104 that will be associated such word objects 108 and to which may be assigned a frequency value in, for example, the upper one-third or one-fourth of the aforementioned frequency range. Assuming that the assigned frequency value is sufficiently high, the string "br", for example, would typically be output to the display 60. If a delimiter input is detected with respect to the portion of the output having the association with the word object 108 in the speed-text database, for instance "br", the user would receive the output "Best Regards", it being understood that the user might also have entered a selection input as to the exemplary string "br".

The contents of any of the other data sources 99 may be treated as word objects 108 and may be associated with generated frequency objects 104 having the assigned frequency value in the aforementioned upper portion of the frequency range. After such word objects 108 are identified, the new word learning function can, if appropriate, act upon such word objects 108 in the fashion set forth above.

Again regarding FIG. 3a, when processing proceeds to the filtration step, as at 232, and the duplicate word objects 108 and the associated frequency objects 104 having relatively lower frequency values are filtered, the remaining results may include a variant word object 108 and a default word object 108, both of which were obtained from the frequency learning database 96. In such a situation, it can be envisioned that if a user repetitively and alternately uses one word then the other word, over time the frequency objects 104 associated with such words will increase well beyond the aforementioned maximum absolute frequency value for a frequency object 104. Accordingly, if it is determined that both the default word object 108 and the variant word object 108 in the learning function were obtained from the frequency learning database 96, instead of storing the variant word object 108 in the frequency learning database 96 and associating it with a frequency object 104 having a relatively increased frequency value, instead the learning function stores the default word object 108 and associates it with a revised frequency object 104 having a frequency value that is relatively lower than that of the frequency object 104 that is associated with the variant word object 108. Such a scheme advantageously avoids excessive and unnecessary increases in frequency value.

If it is determined, such as at 268, that the current input is a movement input, such as would be employed when a user is seeking to edit an object, either a completed word or a prefix object within the current session, the caret 84 is moved, as at 272, to the desired location, and the flag is set, as at 276. Processing then returns to where additional inputs can be detected, as at 204.

In this regard, it is understood that various types of movement inputs can be detected from the input device 8. For instance, a rotation of the thumbwheel 32, such as is indicated by the arrow 34 of FIG. 1, could provide a movement input, as could the actuation of the <NEXT> key 40, or other such input, potentially in combination with other devices in the input apparatus 8. In the instance where such a movement input is detected, such as in the circumstance of an editing input, the movement input is additionally detected as a selection input. Accordingly, and as is the case with a selection input such as is detected at 252, the selected variant is effectively locked with respect to the default portion 76 of the output 64. Any default output 76 during the same session will necessarily include the previously selected variant.

In the context of editing, however, the particular displayed object that is being edited is effectively locked except as to the character that is being edited. In this regard, therefore, the other characters of the object being edited, i.e., the characters that are not being edited, are maintained and are employed as a context for identifying additional word objects 108 and the like that correspond with the object being edited. Were this not the case, a user seeking to edit a letter in the middle of a word otherwise likely would see as a new output 64 numerous objects that bear little or no resemblance to the characters of the object being edited since, in the absence of maintaining such context, an entirely new set of prefix objects including all of the permutations of the characters of the various keystrokes of the object being edited would have been generated. New word objects 108 would have been identified as corresponding with the new prefix objects, all of which could significantly change the output 64 merely upon the editing of a single character. By maintaining the other characters currently in the object being edited, and employing such other characters as context information, the user can much more easily edit a word that is depicted on the display 60.

In the present exemplary embodiment of the handheld electronic device 4, if it is determined, as at 252, that the input is not a selection input, and it is determined, as at 260, that the input is not a delimiter input, and it is further determined, as at 268, that the input is not a movement input, in the current exemplary embodiment of the handheld electronic device 4 the only remaining operational input generally is a detection of the <DELETE> key 86 of the keys 28 of the keypad 24. Upon detection of the <DELETE> key 86, the final character of the default output is deleted, as at 280. At this point, the processing generally waits until another input is detected, as at 284. It is then determined, as at 288, whether the new input detected at 284 is the same as the most recent input that was related to the final character that had just been deleted at 280. If so, the default output 76 is the same as the previous default output, except that the last character is the opposite character of the key actuation that generated the last character. Processing then continues to 292 where learning data, i.e., the word object 108 and the associate frequency object 104 associated with the previous default output 76, as well as the word object 108 and the associate frequency object 104 associated with the new default output 76, are stored in the temporary learning data register and the flag is set. Such a key sequence, i.e., an input, the <DELETE> key 86, and the same input as before, is an alternation input. Such an alternation input replaces the default final character with an opposite final character of the key 28 which generated the final character 48 of the default output 76. The alternation input is treated as a selection input for purposes of locking the default output 76 for the current session, and also triggers the flag which will initiate the learning function upon detection of a delimiter input at 260.

If it turns out, however, that the system detects at 288 that the new input detected at 284 is different than the input immediately prior to detection of the <DELETE> key 86, processing continues at 212 where the input is determined to be either an operational input or an input of a key having one or more characters 48, and processing continues thereafter.

It is also noted that when the main process reaches the output stage at 248, an additional process is initiated which determines whether the variant component 72 of the output 64 should be initiated. Processing of the additional function is initiated from 248 at element 504 of FIG. 6. Initially, the method at 508 outputs the text component 68 of the output 64 to the display 60. Further processing determines whether or not the variant component 72 should be displayed.

Specifically, it is determined, as at 512, whether the variant component 72 has already been displayed during the current session. If the variant component 72 has already been displayed, processing continues at 516 where the new variant component 72 resulting from the current disambiguation cycle within the current session is displayed. Processing then returns to a termination point at 520, after which processing returns to the main process at 204. If, however, it is determined at 512 that the variant component 72 has not yet been displayed during the current session, processing continues, as at 524, to determine whether the elapsed time between the current input and the immediately previous input is longer than a predetermined duration. If it is longer, then processing continues at 516 where the variant component 72 is displayed and processing returns, through 520, to the main process, as at 204. However, if it is determined at 524 that the elapsed time between the current input and the immediately previous input is less than the predetermined duration, the variant component 72 is not displayed and processing returns to the termination point at 520, after which processing returns to the main process, as at 204.

Advantageously, therefore, if a user is entering keystrokes relatively quickly, the variant component 72 will not be output to the display 60, where it otherwise would likely create a visual distraction to a user seeking to enter keystrokes quickly. If at any time during a given session the variant component 72 is output to the display 60, such as if the time between successive inputs exceeds the predetermined duration, the variant component 72 will continue to be displayed throughout that session. However, upon the initiation of a new session, the variant component 72 will be withheld from the display if the user consistently is entering keystrokes relatively quickly.

An exemplary input sequence is depicted in FIGS. 1 and 7-11. In this example, the user is attempting to enter the word "APPLOADER", and this word presently is not stored in the memory 20. In FIG. 1 the user has already typed the "AS" key 28. Since the data tables in the memory 20 are organized according to two-letter prefixes, the contents of the output 64 upon the first keystroke are obtained from the N-gram objects 112 within the memory. The first keystroke "AS" corresponds with a first N-gram object 112 "S" and an associated frequency object 104, as well as another N-gram object 112 "A" and an associated frequency object 104. While the frequency object 104 associated with "S" has a frequency value greater than that of the frequency object 104 associated with "A", it is noted that "A" is itself a complete word. A complete word is always provided as the default output 76 in favor of other prefix objects that do not match complete words, regardless of associated frequency value. As such, in FIG. 1, the default portion 76 of the output 64 is "A".

In FIG. 7, the user has additionally entered the "OP" key 28. The variants are depicted in FIG. 7. Since the prefix object "SO" is also a word, it is provided as the default output 76. In FIG. 8, the user has again entered the "OP" key 28 and has also entered the "L" key 28. It is noted that the exemplary "L" key 28 depicted herein includes only the single character 48 "L".

It is assumed in the instant example that no operational inputs have thus far been detected. The default output 76 is "APPL", such as would correspond with the word "APPLE". The prefix "APPL" is depicted both in the text component 68, as well as in the default portion 76 of the variant component 72. Variant prefix objects in the variant portion 80 include "APOL", such as would correspond with the word "APOLOGIZE", and the prefix "SPOL", such as would correspond with the word "SPOLIATION".

It is particularly noted that the additional variants "AOOL", "AOPL", "SOPL", and "SOOL" are also depicted as variants 80 in the variant component 72. Since no word object 108 corresponds with these prefix objects, the prefix objects are considered to be orphan prefix objects for which a corresponding word object 108 was not identified. In this regard, it may be desirable for the variant component 72 to include a specific quantity of entries, and in the case of the instant exemplary embodiment the quantity is seven entries. Upon obtaining the result at 224, if the quantity of prefix objects in the result is fewer than the predetermined quantity, the disambiguation function will seek to provide additional outputs until the predetermined number of outputs are provided. In the absence of artificial variants having been created, the additional variant entries are provided by orphan prefix objects. It is noted, however, that if artificial variants had been generated, they likely would have occupied a place of preference in favor of such orphan prefix objects, and possibly also in favor of the prefix objects of the result.

It is further noted that such orphan prefix objects may actually be offspring orphan prefix objects from suspended parent orphan prefix objects and/or artificial variants. Such offspring orphan prefix objects can be again output depending upon frequency ranking as explained below, or as otherwise ranked.

The orphan prefix objects are ranked in order of descending frequency with the use of the N-gram objects 112 and the associated frequency objects 104. Since the orphan prefix objects do not have a corresponding word object 108 with an associated frequency object 104, the frequency objects 104 associated with the various N-gram objects 112 must be employed as a fallback.

Using the N-gram objects 112, the disambiguation function first seeks to determine if any N-gram object 112 having, for instance, three characters is a match for, for instance, a final three characters of any orphan prefix object. The example of three characters is given since the exemplary embodiment of the handheld electronic device 4 includes N-gram objects 112 that are an exemplary maximum of the three characters in length, but it is understood that if the memory 20 included N-gram objects four characters in length or longer, the disambiguation function typically would first seek to determine whether an N-gram object having the greatest length in the memory 20 matches the same quantity of characters at the end of an orphan prefix object.

If only one prefix object corresponds in such a fashion to a three character N-gram object 112, such orphan prefix object is listed first among the various orphan prefix objects in the variant output 80. If additional orphan prefix objects are matched to N-gram objects 112 having three characters, then the frequency objects 104 associated with such identified N-gram objects 112 are analyzed, and the matched orphan prefix objects are ranked amongst themselves in order of decreasing frequency.

If it is determined that a match cannot be obtained with an N-gram object 112 having three characters, then two-character N-gram objects 112 are employed. Since the memory 20 includes all permutations of two-character N-gram objects 112, a last two characters of each orphan prefix object can be matched to a corresponding two-character N-gram object 112. After such matches are achieved, the frequency objects 104 associated with such identified N-gram objects 112 are analyzed, and the orphan prefix objects are ranked amongst themselves in descending order of frequency value of the frequency objects 104 that were associated with the identified N-gram objects 112. It is further noted that artificial variants can similarly be rank ordered amongst themselves using the N-gram objects 112 and the associated frequency objects 104.

In FIG. 9 the user has additionally entered the "OP" key 28. In this circumstance, and as can be seen in FIG. 9, the default portion 76 of the output 64 has become the prefix object "APOLO" such as would correspond with the word "APOLOGIZE", whereas immediately prior to the current input the default portion 76 of the output 64 of FIG. 8 was "APPL" such as would correspond with the word "APPLE." Again, assuming that no operational inputs had been detected, the default prefix object in FIG. 9 does not correspond with the previous default prefix object of FIG. 8. As such, the first artificial variant "APOLP" is generated and in the current example is given a preferred position. The aforementioned artificial variant "APOLP" is generated by deleting the final character of the default prefix object "APOLO" and by supplying in its place an opposite character 48 of the key 28 which generated the final character of the default portion 76 of the output 64, which in the current example of FIG. 9 is "P", so that the aforementioned artificial variants is "APOLP".

Furthermore, since the previous default output "APPL" corresponded with a word object 108, such as the word object 108 corresponding with the word "APPLE", and since with the addition of the current input the previous default output "APPL" no longer corresponds with a word object 108, two additional artificial variants are generated. One artificial variant is "APPLP" and the other artificial variant is "APPLO", and these correspond with the previous default output "APPL" plus the characters 48 of the key 28 that was actuated to generate the current input. These artificial variants are similarly output as part of the variant portion 80 of the output 64.

As can be seen in FIG. 9, the default portion 76 of the output 64 "APOLO" no longer seems to match what would be needed as a prefix for "APPLOADER", and the user likely anticipates that the desired word "APPLOADER" is not already stored in the memory 20. As such, the user provides a selection input, such as by scrolling with the thumbwheel 32, or by actuating the <NEXT> key 40, until the variant string "APPLO" is highlighted. The user then continues typing and enters the "AS" key.

The output 64 of such action is depicted in FIG. 10. Here, the string "APPLOA" is the default portion 76 of the output 64. Since the variant string "APPLO" became the default portion 76 of the output 64 (not expressly depicted herein) as a result of the selection input as to the variant string "APPLO", and since the variant string "APPLO" does not correspond with a word object 108, the character strings "APPLOA" and "APPLOS" were created as an artificial variants. Additionally, since the previous default of FIG. 9, "APOLO" previously had corresponded with a word object 108, but now is no longer in correspondence with the default portion 76 of the output 64 of FIG. 10, the additional artificial variants of "APOLOA" and "APOLOS" were also generated. Such artificial variants are given a preferred position in favor of the three displayed orphan prefix objects.

Since the current input sequence in the example no longer corresponds with any word object 108, the portions of the method related to attempting to find corresponding word objects 108 are not executed with further inputs for the current session. That is, since no word object 108 corresponds with the current input sequence, further inputs will likewise not correspond with any word object 108. Avoiding the search of the memory 20 for such nonexistent word objects 108 saves time and avoids wasted processing effort.

As the user continues to type, the user ultimately will successfully enter the word "APPLOADER" and will enter a delimiter input. Upon detection of the delimiter input after the entry of "APPLOADER", the learning function is initiated. Since the word "APPLOADER" does not correspond with a word object 108 in the memory 20, a new word object 108 corresponding with "APPLOADER" is generated and is stored in the new words database 92, along with a corresponding new frequency object 104 which is given an absolute frequency in the upper, say, one-third or one-fourth of the possible frequency range. In this regard, it is noted that the new words database 92 and the frequency learning database 96 are generally organized in two-character prefix data tables similar to those found in the generic word list 88. As such, the new frequency object 104 is initially assigned an absolute frequency value, but upon storage the absolute frequency value, if it is not the maximum value within that data table, will be changed to include a normalized frequency value percentage normalized to whatever is the maximum frequency value within that data table.

As a subsequent example, in FIG. 11 the user is trying to enter the word "APOLOGIZE". The user has entered the key sequence "AS" "OP" "OP" "L" "OP". Since "APPLOADER" has now been added as a word object 108 to the new words database 92 and has been associated with frequency object 104 having a relatively high frequency value, the prefix object "APPLO" which corresponds with "APPLOADER" has been displayed as the default portion 76 of the output 64 in favor of the variant prefix object "APOLO", which corresponds with the desired word "APOLOGIZE." Since the word "APOLOGIZE" corresponds with a word object 108 that is stored at least in the generic word list 88, the user can simply continue to enter keystrokes corresponding with the additional letters "GIZE", which would be the letters in the word "APOLOGIZE" following the prefix object "APOLO", in order to obtain the word "APOLOGIZE". Alternatively, the user may, upon seeing the output 64 depicted in FIG. 11, enter a selection input to affirmatively select the variant prefix object "APOLO". In such a circumstance, the learning function will be triggered upon detection of a delimiter symbol, and the word object 108 that had corresponded with the character string "APOLO" at the time the selection input was made will be stored in the frequency learning database 96 and will be associated with a revised frequency object 104 having a relatively higher frequency value that is similarly stored in the frequency learning database 96.

An additional feature of the handheld electronic device 4 is depicted generally in FIG. 12. In some circumstances, it is desirable that the disambiguation function be disabled. For instance, when it is desired to enter a password, disambiguation typically is relatively more cumbersome than during ordinary text entry. As such, when the system focus is on the component corresponding with the password field, the component indicates to the API that special processing is requested, and the API disables the disambiguation function and instead enables, for instance, a multi-tap input interpretation system. Alternatively, other input interpretation systems could include a chording system or a press-and-hold/press-and-release interpretation system. As such, while an input entered with the disambiguation function active is an ambiguous input, by enabling the alternative interpretation system, such as the exemplary multi-tap system, each input can be largely unambiguous.

As can be understood from FIG. 12, each unambiguous input is displayed for a very short period of time within the password field 120, and is then replaced with another output, such as the asterisk. The character "R" is shown displayed, it being understood that such display is only for a very short period of time.

As can be seen in FIGS. 1 and 7-11, the output 64 includes the displayed graphic 46 near the lower end of the variant component 72, and that the displayed graphic 46 is highly similar to the graphic 42 of the <NEXT> key 40. Such a depiction provides an indication to the user which of the keys 28 of the keypad 24 can be actuated to select a variant output. The depiction of the displayed graphic 46 provides an association between the output 64 and the <NEXT> key 40 in the user's mind. Additionally, if the user employs the <NEXT> key 40 to provide a selection input, the user will be able to actuate the <NEXT> key 40 without moving the user's hands away from the position the hands were in with respect to the housing 6 during text entry, which reduces unnecessary hand motions, such as would be required if a user needed to move a hand to actuate the thumbwheel 32. This saves time and effort.

It is also noted that the system can detect the existence of certain predefined symbols as being delimiter signals if no word object 108 corresponds with the text entry that includes the symbol. For instance, if the user desired to enter the input "one-off", the user might begin by entering the key sequence "OP" "BN" "ER" "ZX" "OP", with the "ZX" actuation being intended to refer to the hyphen symbol disposed thereon. Alternatively, instead of typing the "ZX" key the user might actuate an <ALT> entry to unambiguously indicate the hyphen.

Assuming that the memory 20 does not already include a word object 108 of "one-off", the disambiguation function will detect the hyphen as being a delimiter input. As such, the key entries preceding the delimiter input will be delimited from the key entries subsequent to the delimiter input. As such, the desired input will be searched as two separate words, i.e., "ONE" and "OFF", with the hyphen therebetween. This facilitates processing by more narrowly identifying what is desired to be searched.

Figure 13:
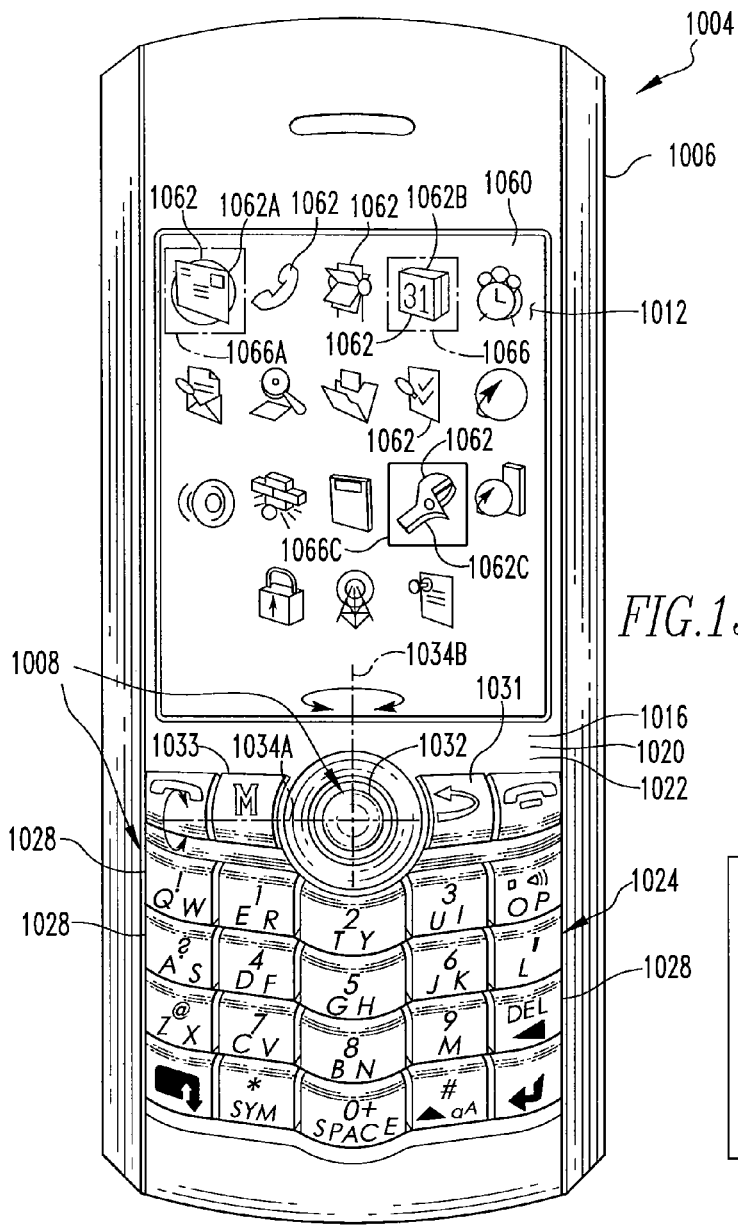
FIG. 13 is a top plan view of an improved handheld electronic device in accordance with another embodiment of the disclosed and claimed concept.

An improved handheld electronic device 1004 in accordance with another embodiment of the disclosed and claimed concept is depicted generally in FIG. 13. As a general matter, the handheld electronic device 1004 is substantially identical in configuration and function to the handheld electronic device 4, except that the handheld electronic device 1004 employs a multiple-axis input device instead of or in addition to the thumbwheel 32. In the depicted exemplary embodiment, the multiple-axis input device is a track ball 1032 as will be described below. It is noted, however, that multiple-axis input devices other than the track ball 1032 can be employed without departing from the present concept. For instance, other appropriate multiple-axis input devices could include mechanical devices such as joysticks and the like and/or non-mechanical devices such as touch pads, track pads and the like and/or other devices which detect motion or input in other fashions, such as through the use of optical sensors or piezoelectric crystals.

The handheld electronic device 1004 includes a housing 1006 upon which is disposed a processor unit that includes an input apparatus 1008, an output apparatus 1012, a processor 1016, a memory 1020, and a number of routines 1022. All of the operations that can be performed on or with the handheld electronic device 4 can be performed on or with the handheld electronic device 1004. As such, the features of the handheld electronic device 4 that are common with the handheld electronic device 1004, and this would comprise essentially all of the features of the handheld electronic device 4, will generally not be repeated.

The output apparatus 1012 includes a display 1060 that provides visual output. The exemplary output in FIG. 13 is a plurality of icons 1062 that are selectable by the user for the purpose of, for example, initiating the execution on the processor 1016 of a routine 1022 that is represented by an icon 1062.

The input apparatus 1008 can be said to comprise a keypad 1024 and the track ball 1032, all of which serve as input members. The keypad 1024 and the track ball 1032 are advantageously disposed adjacent one another. The keypad 1024 comprises a plurality of keys 1028 that are actuatable to provide input to the processor 1016. Many of the keys 1028 have assigned thereto a plurality of linguistic elements in the exemplary form of Latin letters. Other keys 1028 can have assigned thereto functions and/or other characters.

For instance, one of the keys 1028 is an <ESCAPE> key 1031 which, when actuated, provides to the processor 1016 an input that undoes the action which resulted from the immediately preceding input and/or moves the user to a logically higher position within the logical menu tree managed by a graphical user interface (GUI) routine 1022. The function provided by the <ESCAPE> key 1031 can be used at any logical location within any portion of the logical menu tree except, perhaps, at a home screen such as is depicted in FIG. 13. The <ESCAPE> key 1031 is advantageously disposed adjacent the track ball 1032 thereby enabling, for example, an unintended or incorrect input from the track ball 1032 to be quickly undone, i.e., reversed, by an actuation of the adjacent <ESCAPE> key 1031.

Figure 14:
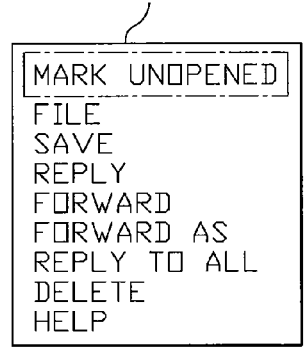
FIG. 14 depicts an exemplary menu that can be output on the handheld electronic device of FIG. 13.
Figure 15:
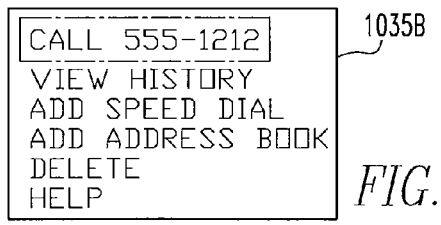
FIG. 15 depicts another exemplary menu.

Another of the keys 1028 is a <MENU> key 1033 which, when actuated, provides to the processor 1016 an input that causes the GUI 1022 to generate and output on the display 1060 a menu that is appropriate to the user's current logical location within the logical menu tree. For instance, FIG. 14 depicts an exemplary menu 1035A that would be appropriate if the user's current logical location within the logical menu tree was viewing an email within an email routine 1022. That is, the menu 1035A provides selectable options that would be appropriate for a user given that the user is, for example, viewing an email within an email routine 1022. In a similar fashion, FIG. 15 depicts another exemplary menu 1035B that would be depicted if the user's current logical location within the logical menu tree was within a telephone routine 1022.

The track ball 1032 is disposed on the housing 1006 and is freely rotatable in all directions with respect to the housing 1006. A rotation of the track ball 1032 a predetermined rotational distance with respect to the housing 1006 provides an input to the processor 1016, and such inputs can be employed by the routines 1022, for example, as navigational inputs, scrolling inputs, selection inputs, and other inputs.

For instance, the track ball 1032 is rotatable about a horizontal axis 1034A to provide vertical scrolling, navigational, selection, or other inputs. Similarly, the track ball 1032 is rotatable about a vertical axis 1034B to provide horizontal scrolling, navigational, selection, or other inputs. Since the track ball 1032 is freely rotatable with respect to the housing 1006, the track ball 1032 is additionally rotatable about any other axis (not expressly depicted herein) that lies within the plane of the page of FIG. 13 or that extends out of the plane of the page of FIG. 13.

The track ball 1032 can be said to be a multiple-axis input device because it provides scrolling, navigational, selection, and other inputs in a plurality of directions or with respect to a plurality of axes, such as providing inputs in both the vertical and the horizontal directions. It is reiterated that the track ball 1032 is merely one of many multiple-axis input devices that could be employed on the handheld electronic device 1004. As such, mechanical alternatives to the track ball 1032, such as a joystick, might have a limited rotation with respect to the housing 1006, and non-mechanical alternatives might be immovable with respect to the housing 1006, yet all are capable of providing input in a plurality of directions or along a plurality of axes.

The track ball 1032 additionally is translatable toward the housing 1006, i.e., into the plane of the page of FIG. 13, to provide additional inputs. The track ball 1032 could be translated in such a fashion by, for example, a user applying an actuating force to the track ball 1032 in a direction toward the housing 1006, such as by pressing on the track ball 1032. The inputs that are provided to the processor 1016 as a result of a translation of the track ball 1032 in the indicated fashion can be employed by the routines 1022, for example, as selection inputs, delimiter inputs, or other inputs.

The track ball 1032 is rotatable to provide, for example, navigational inputs among the icons 1062. For example, FIG. 13 depicts the travel of an indicator 1066 from the icon 1062A, as is indicated in broken lines with the indicator 1066A, to the icon 1062B, as is indicated in broken lines with the indicator 1066B, and onward to the icon 1062C, as is indicated by the indicator 1066C. It is understood that the indicators 1066A, 1066B, and 1066C are not necessarily intended to be simultaneously depicted on the display 1060, but rather are intended to together depict a series of situations and to indicate movement of the indicator 1066 among the icons 1062. The particular location of the indicator 1066 at any given time indicates to a user the particular icon 1062, for example, that is the subject of a selection focus of the handheld electronic device 1004. Whenever an icon 1062 or other selectable object is the subject of the selection focus, a selection input to the processor 1016 will result in the routine 1022 or other function represented by the icon 1062 or other selectable object to be executed or initiated.

The movement of the indicator 1066 from the icon 1062A, as indicated with the indicator 1066A, to the icon 1062B, as is indicated by the indicator 1066B, was accomplished by rotating the track ball 1032 about the vertical axis 1034B to provide a horizontal navigational input. As mentioned above, a rotation of the track ball 1032 a predetermined rotational distance results in an input to the processor 1016. In the present example, the track ball 1032 would have been rotated about the vertical axis 1034B a rotational distance equal to three times the predetermined rotational distance since the icon 1062B is disposed three icons 1062 to the right the icon 1062A. Such rotation of the track ball 1032 likely would have been made in a single motion by the user, but this need not necessarily be the case.

Similarly, the movement of the indicator 1066 from the icon 1062B, as indicated by the indicator 1066B, to the icon 1062C, as is indicated by the indicator 1066C, was accomplished by the user rotating the track ball 1032 about the horizontal axis 1034A to provide a vertical navigational input. In so doing, the track ball 1032 would have been rotated a rotational distance equal to two times the predetermined rotational distance since the icon 1062C is disposed two icons 1062 below the icon 1062B. Such rotation of the track ball 1032 likely would have been made in a single motion by the user, but this need not necessarily be the case.

It thus can be seen that the track ball 1032 is rotatable in various directions to provide various navigational and other inputs to the processor 1016. Rotational inputs by the track ball 1032 typically are interpreted by whichever routine 1022 is active on the handheld electronic device 1004 as inputs that can be employed by such routine 1022. For example, the GUI 1022 that is active on the handheld electronic device 1004 in FIG. 13 requires vertical and horizontal navigational inputs to move the indicator 1066, and thus the selection focus, among the icons 1062. If a user rotated the track ball 1032 about an axis oblique to the horizontal axis 1034A and the vertical axis 1034B, the GUI 1022 likely would resolve such an oblique rotation of the track ball 1032 into vertical and horizontal components which could then be interpreted by the GUI 1022 as vertical and horizontal navigational movements, respectively. In such a situation, if one of the resolved vertical and horizontal navigational movements is of a greater magnitude than the other, the resolved navigational movement having the greater magnitude would be employed by the GUI 1022 as a navigational input in that direction to move the indicator 1066 and the selection focus, and the other resolved navigational movement would be ignored by the GUI 1022, for example.

When the indicator 1066 is disposed on the icon 1062C, as is indicated by the indicator 1066C, the selection focus of the handheld electronic device 1004 is on the icon 1062C. As such, a translation of the track ball 1032 toward the housing 1006 as described above would provide an input to the processor 1016 that would be interpreted by the GUI 1022 as a selection input with respect to the icon 1062C. In response to such a selection input, the processor 1016 would, for example, begin to execute a routine 1022 that is represented by the icon 1062C. It thus can be understood that the track ball 1032 is rotatable to provide navigational and other inputs in multiple directions, assuming that the routine 1022 that is currently active on the handheld electronic device 1004 can employ such navigational or other inputs in a plurality of directions, and can also be translated to provide a selection input or other input.

Rotational movement inputs from the track ball 1032 could be employed to navigate among, for example, the menus 1035A and 1035B. For instance, after an actuation of the <MENU> key 1033 and an outputting by the GUI 1022 of a resultant menu, the user could rotate the track ball 1032 to provide scrolling inputs to successively highlight the various selectable options within the menu. Once the desired selectable option is highlighted, i.e., is the subject of the selection focus, the user could translate the track ball 1032 toward the housing 1006 to provide a selection input as to the highlighted selectable option. In this regard, it is noted that the <MENU> key 1033 is advantageously disposed adjacent the track ball 1032. This enables, for instance, the generation of a menu by an actuation the <MENU> key 1033, conveniently followed by a rotation the track ball 1032 to highlight a desired selectable option, for instance, followed by a translation of the track ball 1032 toward the housing 1006 to provide a selection input to initiate the operation represented by the highlighted selectable option.

It is further noted that one of the additional inputs that can be provided by a translation of the track ball 1032 is an input that causes the GUI 1022 to output a reduced menu. For instance, a translation of the track ball 1032 toward the housing 1066 could result in the generation and output of a more limited version of a menu than would have been generated if the <MENU> key 1033 had instead been actuated. Such a reduced menu would therefore be appropriate to the user's current logical location within the logical menu tree and would provide those selectable options which the user would have a high likelihood of selecting. Rotational movements of the track ball 1032 could provide scrolling inputs to scroll among the selectable options within the reduced menu 1035C, and translation movements of the track ball 1032 could provide selection inputs to initiate whatever function is represented by the selectable option within the reduce menu 1032 that is currently highlighted.

Figure 16:
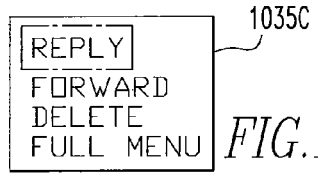
FIG. 16 depicts an exemplary reduced menu.

By way of example, if instead of actuating the <MENU> key 1033 to generate the menu 1035A the user translated the track ball 1032, the GUI 1022 would generate and output on the display the reduced menu 1035C that is depicted generally in FIG. 16. The exemplary reduced menu 1035C provides as selectable options a number of the selectable options from the menu 1035A that the user would be most likely to select. As such, a user seeking to perform a relatively routine function could, instead of actuating the <MENU> key 1033 to display the full menu 1035A, translate the track ball 1032 to generate and output the reduced menu 1035C. The user could then conveniently rotate the track ball 1032 to provide scrolling inputs to highlight a desired selectable option, and could then translate the track ball 1032 to provide a selection input which would initiate the function represented by the selectable option in the reduced menu 1035C that is currently highlighted.

In the present exemplary embodiment, many of the menus that could be generated as a result of an actuation of the <MENU> key 1033 could instead be generated and output in reduced form as a reduced menu in response to a translation of the track ball 1032 toward the housing 1006. It is noted, however, that a reduced menu might not be available for each full menu that could be generated from an actuation of the <MENU> key 1033. Depending upon the user's specific logical location within the logical menu tree, a translation of the track ball 1032 might be interpreted as a selection input rather than an input seeking a reduced menu. For instance, a translation of the track ball 1032 on the home screen depicted in FIG. 13 would result in a selection input as to whichever of the icons 1062 is the subject of the input focus. If the <MENU> key 1033 was actuated on the home screen, the GUI 1022 would output a menu appropriate to the home screen, such as a full menu of all of the functions that are available on the handheld electronic device 1004, including those that might not be represented by icons 1062 on the home screen.

Figure 17:
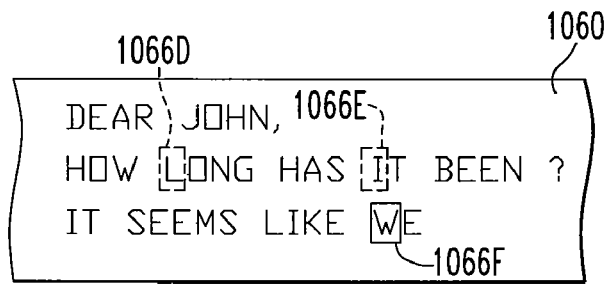
FIG. 17 is an exemplary output such as could occur during a text entry or text editing operation.

FIG. 17 depicts a quantity of text that is output on the display 1060, such as during a text entry operation or during a text editing operation, for example. The indicator 1066 is depicted in FIG. 17 as being initially over the letter "L", as is indicated with the indicator 1066D, and having been moved horizontally to the letter "I", as is indicated by the indicator 1066E, and thereafter vertically moved to the letter "W", as is indicated by the indicator 1066F. In a fashion similar to that in FIG. 13, the cursor 1066 was moved among the letters "L", "I", and "W" through the use of horizontal and vertical navigational inputs resulting from rotations of the track ball 1032. In the example of FIG. 17, however, each rotation of the track ball 1032 the predetermined rotational distance would move the indicator 1066 to the next adjacent letter. As such, in moving the indicator 1066 between the letters "L" and "I," the user would have rotated the track ball 1032 about the vertical axis 1034B a rotational distance equal to nine times the predetermined rotational distance, for example, since "I" is disposed nine letters to the right of "L".

Figure 18:
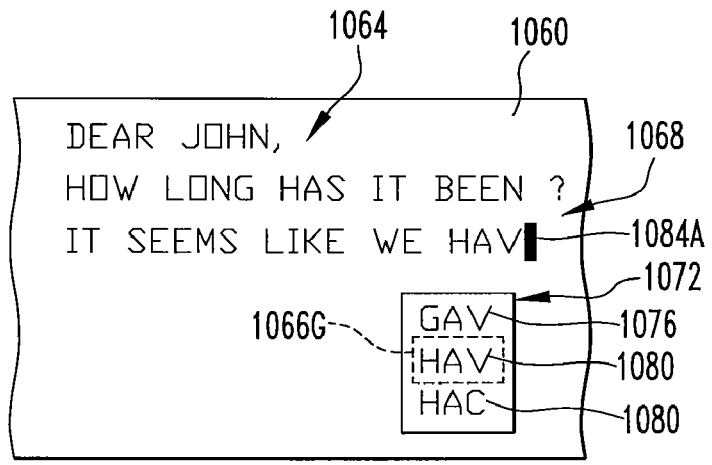
FIG. 18 is an exemplary output during a text entry operation.

FIG. 18 depicts an output 1064 on the display 1060 during, for example, a text entry operation that employs the disambiguation routine 1022. The output 1064 can be said to comprise a text component 1068 and a variant component 1072. The variant component 1072 comprises a default portion 1076 and a variant portion 1080. FIG. 18 depicts the indicator 1066G on the variant 1080 "HAV", such as would result from a rotation of the track ball 1032 about the horizontal axis 1034A to provide a downward vertical scrolling input. In this regard, it is understood that a rotation of the track ball 1032 a distance equal to the predetermined rotational distance would have moved the indicator 1066 from a position (not expressly depicted herein) disposed on the default portion 1076 to the position disposed on the first variant 1080, as is depicted in FIG. 18. Since such a rotation of the track ball 1032 resulted in the first variant 1080 "HAV" being highlighted with the indicator 1066G, the text component 1068 likewise includes the text "HAV" immediately preceding a cursor 1084A.

Figure 19:
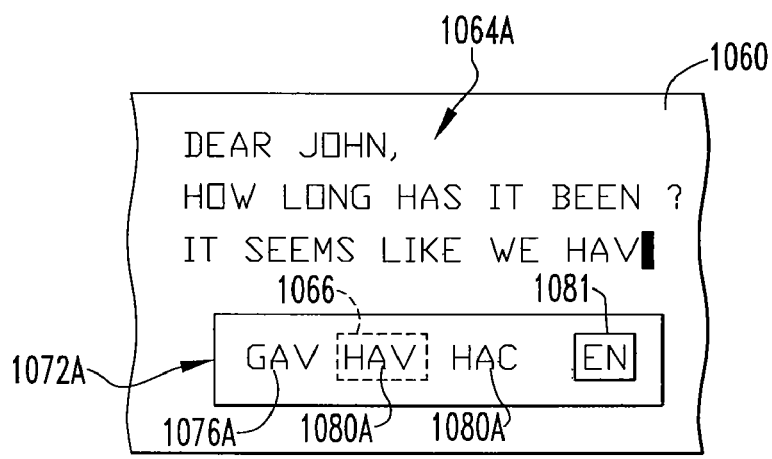
FIG. 19 is an alternative exemplary output during a text entry operation.

FIG. 19 depict an alternative output 1064A having an alternative variant component 1072A having a default portion 1076A and a variant portion 1080A. The variant component 1072A is horizontally arranged, meaning that the default portion 1076A and the variants 1080A are disposed horizontally adjacent one another and can be sequentially selected by the user through the use of horizontal scrolling inputs, such as by the user rotating the track ball 1032 the predetermined rotational distance about the vertical axis 1034B. This is to be contrasted with the variant component 1072 of FIG. 18 wherein the default portion 1076 and the variants 1080 are vertically arranged, and which can be sequentially selected by the user through the user of vertical scrolling inputs with the track ball 1032.

In this regard, it can be understood that the track ball 1032 can provide both the vertical scrolling inputs employed in conjunction with the output 1064 as well as the horizontal scrolling inputs employed in conjunction with the output 1064A. For instance, the disambiguation routine 1022 potentially could allow the user to customize the operation thereof by electing between the vertically arranged variant component 1072 and the horizontally arranged variant component 1072A. The track ball 1032 can provide scrolling inputs in the vertical direction and/or the horizontal direction, as needed, and thus is operable to provide appropriate scrolling inputs regardless of whether the user chooses the variant component 1072 or the variant component 1072A. That is, the track ball 1032 can be rotated about the horizontal axis 1034A to provide the vertical scrolling inputs employed in conjunction with the variant component 1072, and also can be rotated about the vertical axis 1034B to provide the horizontal scrolling inputs that are employed in conjunction with the variant component 1064A. The track ball 1032 thus could provide appropriate navigational, strolling, selection, and other inputs depending upon the needs of the routine 1022 active at any time on the handheld electronic device 1004. The track ball 1032 enables such navigational, strolling, selection, and other inputs to be intuitively generated by the user through rotations of the track ball 1032 in directions appropriate to the active routine 1022, such as might be indicated on the display 1060. Other examples will be apparent.

It can further be seen from FIG. 19 that the variant component 1072A additionally includes a value 1081 that is indicative of the language into which the disambiguation routine 1022 will interpret ambiguous text input. In the example depicted in FIG. 19, the language is English.

Figure 20:
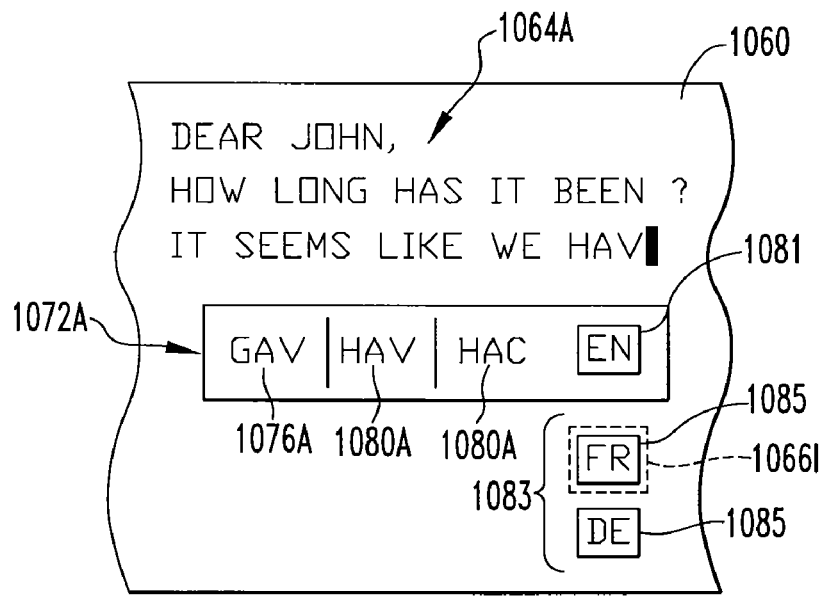
FIG. 20 is another exemplary output during a part of text entry operation.

As can be seen in FIG. 20, the value 1081 can be selected by the user to cause the displaying of a list 1083 of alternative values 1085. The alternative values 1085 are indicative of selectable alternative languages into which the disambiguation routine 1022 can interpret ambiguous input. A selection of the value 1081 would have been achieved, for example, by the user providing horizontal scrolling inputs with the track ball 1032 to cause (not expressly depicted herein) the indicator 1066 to be disposed over the value 1081, and by thereafter translating the track ball 1032 toward the housing 1006 to provide a selection input.

The alternative values 1085 in the list 1083 are vertically arranged with respect to one another and with respect to the value 1081. As such, a vertical scrolling input with the track ball 1032 can result in a vertical movement of the indicator 10661 to a position on one of the alternative values 1085 which, in the present example, is the alternative value 1085 "FR", which is representative of the French language. The alternative value 1085 "FR" could become selected by the user in any of a variety of fashions, such as by actuating the track ball 1032 again, by continuing to enter text, or in other fashions. It thus can be understood from FIG. 19 and FIG. 20 that the track ball 1032 can be rotated to provide horizontal scrolling inputs and, when appropriate, to additionally provide vertical scrolling inputs and, when appropriate, to additionally provide selection inputs, for example.

Figure 21:
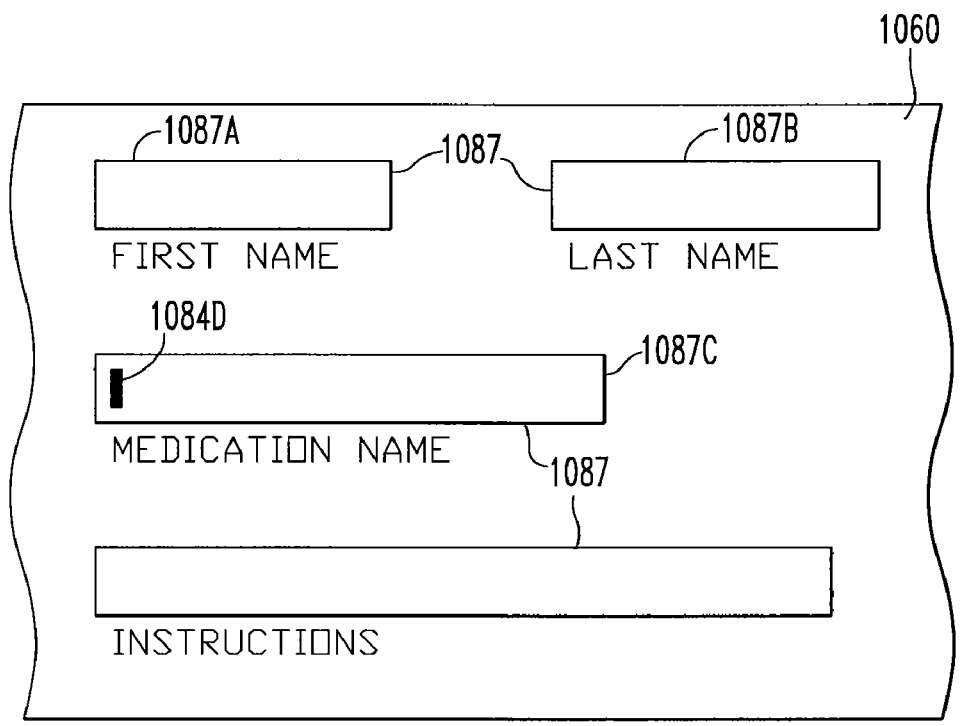
FIG. 21 is an exemplary output during a data entry operation.

FIG. 21 depicts another exemplary output on the display 1060 such as might be employed by a data entry routine 1022. The exemplary output of FIG. 21 comprises a plurality of input fields 1087 with corresponding descriptions. A cursor 1084D, when disposed within one of the input fields 1087, indicates to the user that an input focus of the handheld electronic device 1004 is on that input field 1087. That is, data such as text, numbers, symbols, and the like, will be entered into whichever input field 1087 is active, i.e., is the subject of the input focus. It is understood that the handheld electronic device 1004 might perform other operations or take other actions depending upon which input field 1087 is the subject of the input focus.

Navigational inputs from the track ball 1032 advantageously enable the cursor 1084D, and thus the input focus, to be switched, i.e., shifted, among the various input fields 1087. For example, the input fields 1087 could include the input fields 1087A, 1087B, and 1087C. FIG. 21 depicts the cursor 1084D as being disposed in the input field 1087C, indicating that the input field 1087C is the subject of the input focus of the handheld electronic device 1004. It is understood that the cursor 1084D, and thus the input focus, can be shifted from the input field 1087C to the input field 1087A, which is disposed adjacent and vertically above the input field 1087C, by providing a vertical scrolling input in the upward direction with the track ball 1032. That is, the track ball 1032 would be rotated the predetermined rotational distance about the horizontal axis 1034. Similarly, the cursor 1084D, and thus the input focus, can be shifted from the input field 1087A to the input field 1087B, which is disposed adjacent and to the right of the input field 1087A, by providing a horizontal scrolling input to the right with the track ball 1032. That is, such a horizontal scrolling input could be provided by rotating the track ball the predetermined rotational distance about the vertical axis 1034B. It thus can be seen that the track ball 1032 is rotatable in a plurality of directions about a plurality axes to provide navigational, scrolling, and other inputs in a plurality of directions among a plurality of input fields 1087. Other types of inputs and/or inputs in other applications will be apparent.

Since the keypad 1024 and the track ball 1032 are advantageously disposed adjacent one another, the user can operate the track ball 1032 substantially without moving the user's hands away from the keypad 1024 during a text entry operation or other operation. It thus can be seen that the track ball 1032 combines the benefits of both the thumbwheel 32 and the <NEXT> key 40. It is noted, however, that other embodiments of the handheld electronic device 1004 (not expressly depicted herein) could include both the track ball 1032 and a <NEXT> key such as the <NEXT> key 40 without departing from the present concept.

Figure 22:
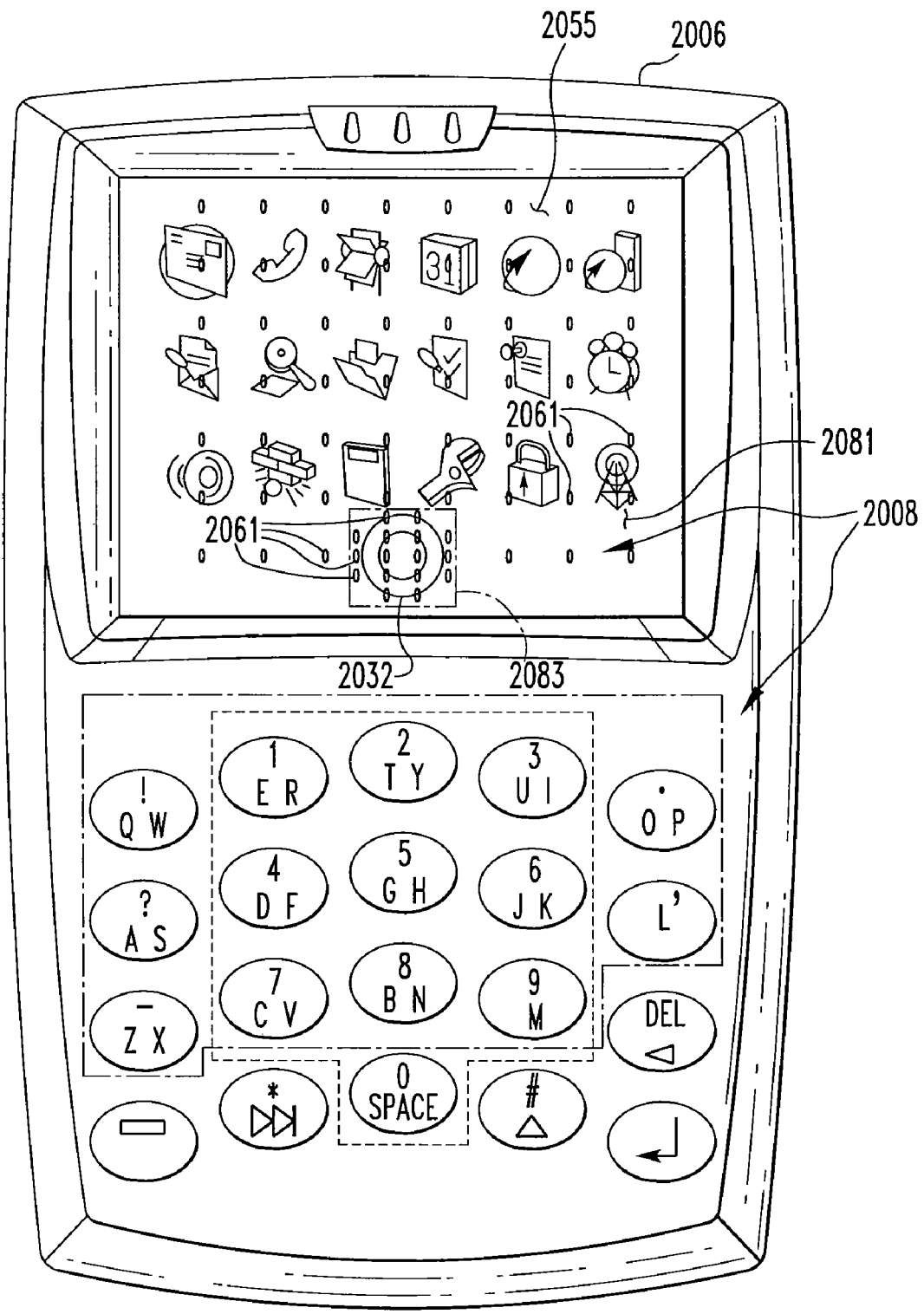
FIG. 22 is a top plan view of an improved handheld electronic device in accordance with still another embodiment of the disclosed and claimed concept.
Figure 23:
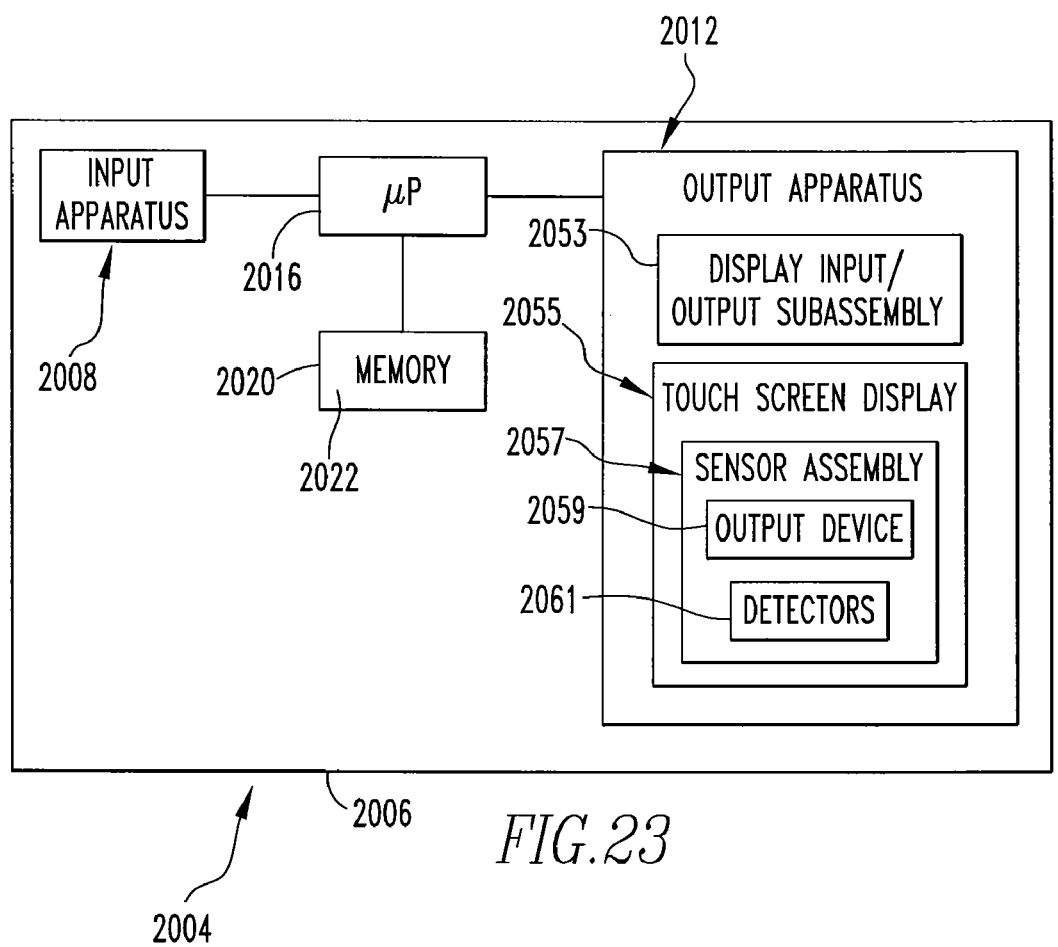
FIG. 23 is a schematic depiction of the improved handheld electronic device of FIG. 22.

An improved handheld electronic device 2004 in accordance with still another embodiment of the disclosed and claimed concept is depicted generally in FIG. 22 and FIG. 23. The handheld electronic device 2004 includes a housing 2006 upon which is disposed a processor unit that includes an input apparatus 2008, an output apparatus 2012, a processor 2016, a memory 2020, and a number of routines 2022. All of the operations that can be performed on or with the handheld electronic devices 4 and/or 1004 can be performed on or with the handheld electronic device 2004. As such, the features of the handheld electronic device 2004 that are common with the handheld electronic devices 4 and/or 1004, and this would comprise essentially all of the features of the handheld electronic devices 4 and/or 1004, will generally not be repeated.

As a general matter, the handheld electronic device 2004 is substantially identical in configuration and function to the handheld electronic device 1004, except that the handheld electronic device 2004 includes a touch screen display 2055 that provides a non-mechanical multiple-axis input device 2032 instead of the track ball 1032. The multiple-axis input device 2032 can be said to be in the form of a virtual track ball 2032.

As is generally understood, the touch screen display 2055 includes a liquid crystal layer between a pair of substrates, with each substrate including an electrode. The electrodes form a grid which defines the aperture size of the pixels. When a charge is applied to the electrodes, the liquid crystal molecules of the liquid crystal layer become aligned generally perpendicular to the two substrates. A display input/output subassembly 2053 of the output apparatus 2012 controls the location of the charge applied to the electrodes thereby enabling the formation of images on the touch screen display 2055.

Additionally, the touch screen display 2055 comprises a sensor assembly 2057 which comprises an output device 2059 and a plurality of detectors 2061. The detectors 2061 are shown schematically and are typically too small to be seen by the naked eye. Each detector 2061 is in electrical communication with the output device 2059 and creates an output signal when actuated. The detectors 2061 are disposed in a pattern, discussed below, and are structured to detect an external object immediately adjacent to, or touching, the touch screen display 2055. The external object is typically a stylus or a user's finger (not shown). The output device 2059 and/or the processor 2016 are structured to receive the detector signals and convert the signals to data representing the location of the external object relative to the touch screen display 2055. As such, while the sensor assembly 2057 is physically a component of the touch screen display 2055, it is nevertheless considered to be a logical component of the input apparatus 2008 since it provides input to the processor apparatus.

The detectors 2061 are typically capacitive detectors, optical detectors, resistive detectors, or mechanical detectors such as strain gauge or charged grid, although other technologies may be employed without departing from the present concept. Typically, capacitive detectors are structured to detect a change in capacitance caused by the electrical field of the external object or a change in capacitance caused by the compression of the capacitive detector. Optical detectors are structured to detect a reflection of light, e.g., light created by the touch screen display 2055. Mechanical detectors include a charged grid with columns that would be disposed on one side of the touch screen display 2055 and a corresponding grid without columns would be disposed at another location on the touch screen display 2055. In such a configuration, when the touch screen display 2055 is compressed, i.e. as a result of being touched by the user, the columns at the area of compression contact the opposing grid thereby completing a circuit.

Capacitive detectors may be disposed upon either substrate and, although small, require space. Thus, and any pixel that is disposed adjacent a detector 2061 will have a reduced size, or aperture, to accommodate the adjacent detector 2061.

The detectors 2061 are disposed in a pattern, and at least some of the detectors 2061 preferably are arranged in lines that form a grid. A first portion of the detectors 2061 are disposed on a first area 2081 of the touch screen display 2055, and a second portion of the detectors 2061 are disposed on a second area 2083 of the touch screen display 2055. As can be seen from FIG. 22, the first area 2081 essentially is every region of the touch screen display 2005 other than the second area 2083.

The first portion of the detectors 2061 disposed on the first area 2081 of the touch screen display 2055 are disposed in a relatively sparse pattern in order to minimize the visual interference that is caused by the presence of the detectors 2061 adjacent the pixels. Preferably, the spacing of the detectors 2061 on the first area 2081 is between about 1.0 mm and 10.0 mm between the detectors 2061, and more preferably about 3.0 mm between the detectors 2061.

The second portion of the detectors 2061 are disposed in a relatively dense pattern on the second area 2083 of the touch screen display 2055 and are structured to support the function of the virtual track ball 2032. The image quality in the second area 2083 of the touch screen display 2055 is adversely affected due to the dense spacing of the detectors 2061 there. However, the second area 2083 is a relatively small area compared to the entire touch screen display 2055. Preferably, the density of the detectors 2061 in the second area 2083 is between about 0.05 mm and 3.0 mm between the detectors, and more preferably about 0.1 mm between the detectors 2061. Further, because the pixels in the second area 2083 are dedicated for the virtual track ball 2032, it is acceptable to have a reduced pixel density with larger pixels. Since the pixel size would be very large, the aspect ratio would be significantly higher than that of pixels that are not disposed adjacent a detector 2061. The pixels in the second area 2083 likely would be special function pixels, such as pixels that would both depict the virtual track ball 2032 and that would light up the second area 2083 to highlight the virtual track ball 2032.

The processor apparatus is structured to create images and define the boundaries of selectable portions of the images on the touch screen display 2055. For example, the processor apparatus will create the images of selectable icons or other objects on specific portions of the touch screen display 2055. The processor apparatus is further structured to relate specific detectors 2061 to the specific portions of the touch screen display 2055. Thus, when the processor apparatus detects the actuation of a specific detector 2061 adjacent to a specific image, e.g. a selectable icon, the processor apparatus will initiate the function or routine related to that icon, e.g. opening a calendar program.

Similarly, the processor apparatus is structured to employ specific detectors 2061 to support the function of the virtual track ball 2032 in the second area 2083 of the touch screen display 2055. Thus, actuations of one or more of the detectors 2061 that support the virtual track ball 2032 will be interpreted by the processor apparatus as being inputs from the virtual track ball 2032. For instance, an actuation of a sequential plurality of detectors 2061 extending along a particular direction on the touch screen display 2055 in the second area 2083 might be interpreted as a navigational input, a scrolling input, a selection input, and/or another input in the particular direction. Since the user can freely move a finger, for instance, in any direction on the touch screen display 2055, the virtual track ball 2032 is a multiple-axis input device. Other inputs, such as a non-moving actuation of one or more detectors 2061 in the central region of the virtual track ball 2032 could be interpreted by the processor apparatus as an actuation input of the virtual track ball 2032, such as would be generated by an actuation of the track ball 1032 of the handheld electronic device 1004 in a direction toward the housing 1006 thereof. It can be understood that other types of actuations of the detectors 2061 in the second area 2083 can be interpreted as various other inputs without departing from the disclosed and claimed concept.

The handheld electronic device 2004 thus comprises a multiple-axis input device 2032 that is non-mechanical but that still provides the same functional features and advantages as, say, the track ball 1032 of the handheld electronic device 1004. It is understood that the virtual track ball 2032 is but one example of the many types of multiple-axis input devices that could be employed on the handheld electronic device 2004.

While specific embodiments of the disclosed and claimed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed and claimed concept which is to be given the full breadth of the claims appended and any and all equivalents thereof.

What is claimed is:

1. A method of disambiguating an input into a handheld electronic device including an output apparatus, an input apparatus having a plurality of input members including a multiple-axis input device, and a memory having stored therein a plurality of objects including a plurality of language objects and a plurality of frequency objects, at least some of the input members each having a plurality of characters assigned thereto, the method comprising:

detecting an ambiguous input;
    determining that a first language object and a second language object correspond with the ambiguous input, the first language object having associated therewith a first frequency object having a first frequency value, the second language object having associated therewith a second frequency object having a second frequency value, one of the first frequency value and the second frequency value having a relatively greater value than the other of the first frequency value and the second frequency value and being associated with one of the first language object and the second language object;
    outputting an output including at least a portion of the one of the first language object and the second language object as a default output and at least a portion of the other of the first language object and the second language object as a variant output;
    detecting an input from the multiple-axis input device as being a selection input associated with the variant output; and
    responsive to a completion of a third language object that includes the variant output, storing a revised frequency object having a revised frequency value different than the other of the first frequency value and the second frequency value and being associated with the other of the first language object and the second language object.

2. The method of claim 1, further comprising setting as the revised frequency value the other of the first frequency value and the second frequency value plus a portion of the difference between the first frequency value and the second frequency value.

3. The method of claim 2, further comprising
    detecting another ambiguous input;
    determining that the first language object and the second language object correspond with the another ambiguous input,
    determining that the one of the first frequency value and the second frequency value has another relatively greater value than the revised frequency value;
    outputting another output including another default output and another variant output;
    outputting at least a portion of the one of the first language object and the second language object as at least a portion of the another default output;
    outputting at least a portion of the other of the first language object and the second language object as at least a portion of the another variant output;
    detecting another selection input associated with said at least a portion of the another variant output;
    detecting a completion of a fourth language object that includes said at least a portion of the another variant output; and
    responsive to said detecting a completion of a fourth language object, storing another revised frequency object having another revised frequency value greater than the one of the first frequency value and the second frequency value and being associated with the other of the first language object and the second language object.

4. The method of claim 1, further comprising detecting an initial selection input, detecting a final selection input associated with said at least a portion of the variant output, the initial selection preceding the final selection input, detecting no other selection input between said detecting the final selection input and said detecting a completion of a third language object, and employing as the selection input the final selection input.

5. The method of claim 1, further comprising, responsive to said detecting a selection input associated with said at least a portion of the variant output, storing as a default learning object the one of the first language object and the second language object and the one of the first frequency object and the second frequency object, storing as a variant learning object the other of the first language object and the second language object and the other of the first frequency object and the second frequency object, and setting a flag.

6. The method of claim 5, further comprising employing the default learning object and the variant learning object to determine the revised frequency value and to determine which of the first language object and the second language object with which to associate the revised frequency value.

7. The method of claim 6, further comprising employing as the default learning object a final default learning object from among a plurality of default learning objects stored prior to said detecting a completion of a third language object, and employing as the variant learning object a final variant learning object from among a plurality of variant learning objects stored prior to said detecting a completion of a third language object.

8. The method of claim 1, further comprising, responsive to said detecting a completion of a third language object, detecting the flag, and, responsive to said detecting the flag, employing the final default learning object and the final variant learning object to determine the revised frequency object and to identify a language object from among the plurality of language objects with which to associate the revised frequency object.

9. The method of claim 1 wherein the memory includes a generic word portion and a learning portion, the plurality of language objects and the plurality of frequency objects being stored in the generic word portion, the revised frequency object being one of a plurality of revised frequency objects stored in the learning portion, each of at least a portion of the plurality of revised frequency objects being associated with an associated language object of the plurality of language objects, further comprising determining that the associated first frequency object is a first revised frequency object from the learning portion, determining that the associated second frequency object is a second revised frequency object from the learning portion, and, responsive to said detecting a completion of a third language object, storing a revised frequency object having a revised frequency value lower than the other of the first frequency value and the second frequency value and being associated with the one of the first language object and the second language object.

10. The method of claim 1, further comprising detecting an alternation input associated with at least a portion of the output, determining that an alternate second language object of the plurality of language objects corresponds with the ambiguous input, determining that an alternate associated second frequency object of the plurality of frequency objects is associated with the alternate second language object and has an alternate second frequency value, employing the alternate second language object as the second language object, employing the alternate associated second frequency object as the associated second frequency object, employing the alternate second frequency value as the second frequency value, and employing the alternation input as the selection input.

11. The method of claim 10, further comprising detecting as the alternation input a deletion input and a reactuation of an input member of the portion of the plurality of input members.

12. The method of claim 1, further comprising detecting as the selection input a scrolling input.

13. The method of claim 1, further comprising determining that the third language object is a user-specified word for which an equivalent language object of the plurality of language object cannot be found, storing the third language object, storing an associated third frequency object having a third frequency value, and assigning to the third frequency value a frequency value greater than the one of the first frequency value and the second frequency value.

14. The method of claim 1, further comprising determining that the third language object is a user-specified word for which an equivalent language object of the plurality of language object cannot be found, storing the third language object, storing an associated third frequency object having a third frequency value, and assigning to the third frequency value an absolute value within about an upper third of a predetermined range of absolute values.

15. The method of claim 1, further comprising detecting a rotation of the multiple-axis input device a predetermined rotational distance as being the input from the multiple-axis input device.

16. The method of claim 1, further comprising detecting an input from a touch screen display as being the input from the multiple-axis input device.

17. The method of claim 16, further comprising outputting on the touch screen display a depiction representative of the multiple-axis input device.

18. A handheld electronic device comprising:
a processor apparatus comprising a processor and a memory having stored therein a plurality of objects including a plurality of language objects and a plurality of frequency objects;
an input apparatus structured to provide input to the processor apparatus and comprising a plurality of input members including a multiple-axis input device, at least some of the input members each having a plurality of characters assigned thereto;
an output apparatus structured to receive output signals from the processor apparatus;
the memory further having stored therein a number of routines which, when executed on the processor, cause the handheld electronic device to perform operations comprising:
detecting an ambiguous input;
determining that a first language object and a second language object correspond with the ambiguous input, the first language object having associated therewith a first frequency object having a first frequency value, the second language object having associated therewith a second frequency object having a second frequency value, one of the first frequency value and the second frequency value having a relatively greater value than the other of the first frequency value and the second frequency value and being associated with one of the first language object and the second language object;
outputting an output including at least a portion of the one of the first language object and the second language object as a default output and at least a portion of the other of the first language object and the second language object as a variant output;
detecting an input from the multiple-axis input device as being a selection input associated with the variant output; and
responsive to a completion of a third language object that includes the variant output, storing a revised frequency object having a revised frequency value different than the other of the first frequency value and the second frequency value and being associated with the other of the first language object and the second language object.

19. The handheld electronic device of claim 18 wherein the operations further comprise detecting a rotation of the multiple-axis input device a predetermined rotational distance as being the input from the multiple-axis input device.

20. The handheld electronic device of claim 18 wherein at least one of the input and the output apparatus comprises at least a component of a touch screen display, and wherein the operations further comprise detecting an input from the at least component of the touch screen display as being the input from the multiple-axis input device.

* * * * *

UNITED STATES PATENT AND TRADEMARK OFFICE
CERTIFICATE OF CORRECTION

| | | |
|---|---|---|
| PATENT NO. | : 8,060,138 B2 | Page 1 of 4 |
| APPLICATION NO. | : 11/831065 | |
| DATED | : November 15, 2011 | |
| INVENTOR(S) | : Vadim Fux | |

Figure 6:
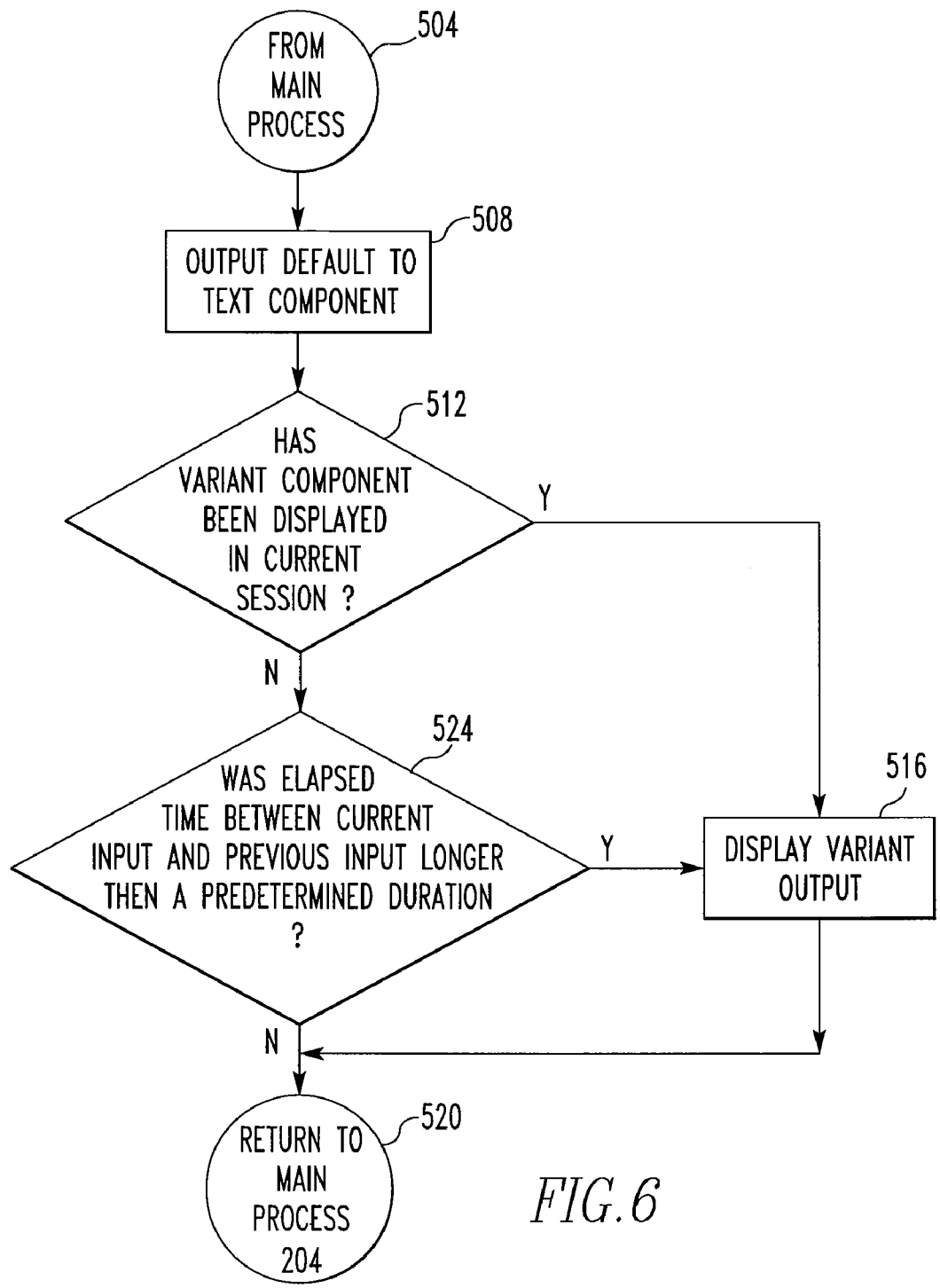
FIG. 6 is another exemplary flowchart depicting certain aspects of a method by which various display formats that can be provided on the handheld electronic device.

It is certified that error appears in the above-identified patent and that said Letters Patent is hereby corrected as shown below:

In FIG. 6, in the diamond representing step 524, line 4, "THEN" should read --THAN--.

In column 1, line 51, "ten keys eight have" should read --ten keys, eight have--.

In column 2, line 11, "holding first key" should read --holding a first key--.

In column 2, line 17, "they systems" should read --these systems--.

In column 2, line 25, "software attempt" should read --software attempts--.

In column 2, line 59, "formats that can" should read --formats can--.

In column 3, line 2, after "operation;", delete "and".

In column 3, line 5, "disabled" should read --disabled;--.

In column 3, line 19, "part of text" should read --part of a text--.

In column 3, line 36, "are disposed" should read --is disposed--.

In column 3, line 38, after "processor", insert --16--.

In column 4, line 31, after "<NEXT> key", insert --40--.

In column 4, line 58, after "display", insert --60--.

In column 5, line 53, after "memory", insert --20--.

In column 5, line 57, "having frequency" should read --having a frequency--.

Signed and Sealed this
Thirteenth Day of March, 2012

David J. Kappos
*Director of the United States Patent and Trademark Office*

CERTIFICATE OF CORRECTION (continued)
U.S. Pat. No. 8,060,138 B2

In column 6, line 23, "N-grams 112." should read --N-gram objects 112.--.

In column 7, line 3, "other object" should read --other objects--.

In column 7, line 24, "as well the" should read --as well as the--.

In column 7, line 26, "FIGS. 3a and 3b depicts" should read --FIGS. 3a and 3b depict--.

In column 7, line 49, "is build up" should read --is built up--.

In column 7, lines 54-55, "completed the current session" should read --completed, the current session--.

In column 7, line 65, "i.e., and input," should read --i.e., an input,--.

In column 8, line 13, after "characters", insert --48--.

In column 8, lines 60-61, "to a four letter prefixes." should read --to four-letter prefixes.--.

In column 9, line 17, "orphan object" should read --orphan objects--.

In column 9, line 48, "include" should read --includes--.

In column 9, line 64, "would have causes" should read --would have caused--.

In column 10, line 6, "word object," should read --word object 108,--.

In column 11, lines 9-10, "flag had not been set," should read --flag has not been set,--.

In column 11, line 34, "of a spawned orphan prefix objects" should read --of spawned orphan prefix objects--.

In column 12, line 34, "memory," should read --memory 20,--.

In column 12, lines 45-46, "and alternation input," should read --an alternation input,--.

In column 12, line 58, "been subject" should --been the subject--.

In column 13, line 18, "that that default" should read --that the default--.

In column 13, line 21, "frequency value 104" should read --frequency object 104--.

In column 13, line 31, "word object 104" should read --word object 108--.

In column 13, line 35, after "memory", insert --20--.

In column 14, line 28, "processor 20" should read --processor 16--.

In column 14, line 29, "associated such" should read --associated with such--.

In column 14, line 64, "value, instead the learning" should read --value, the learning--.

In column 15, line 11, "input device 8." should read --input apparatus 8.--.

In column 15, lines 50-51, "device 4 the only" should read --device 4, the only--.

In column 15, line 63, "the associate frequency" should read --the frequency--.

In column 15, line 65, "the associate frequency" should read --the frequency--.

In column 16, line 54, after "display", insert --60--.

In column 16, line 63, "memory." should read --memory 20.--.

In column 17, lines 4-5, "regardless of associated" should read --regardless of the associated--.

In column 17, line 31, "embodiment the quantity" should read --embodiment, the quantity--.

In column 17, line 63, after "N-gram objects", insert --112--.

In column 17, line 65, after "N-gram object", insert --112--.

In column 18, line 2, "three character" should read --three-character--.

In column 18, line 41, "variants is" should read --variant is--.

In column 18, line 63, "the "AS" key." should read --the "AS" key 28.--.

In column 19, lines 4-5, "created as an artificial variants." should read --created as artificial variants.--.

In column 19, line 37, "upon storage the absolute" should read --upon storage, the absolute--.

In column 20, line 7, "password field," should read --password field 120,--.

In column 20, line 47, "key the user" should read --key, the user--.

In column 22, line 67, "right the icon" should read --right of the icon--.

In column 23, line 67, "actuation the <MENU> key" should read --actuation of the <MENU> key--.

In column 24, line 1, "rotation the track ball" should read --rotation of the track ball--.

In column 24, lines 9-10, "housing 1066" should read --housing 1006--.

In column 24, lines 21-22, "reduce menu 1032" should read --reduced menu 1035C--.

In column 24, line 24, "menu 1035A the user" should read --menu 1035A, the user--.

In column 24, line 26, after "display", insert --1060--.

In column 25, line 29, "FIG. 19 depict" should read --FIG. 19 depicts--.

In column 25, line 41, "through the user of" should read --through the use of--.

In column 25, line 62, "strolling," should read --scrolling,--.

In column 25, line 65, "strolling," should read --scrolling,--.

In column 26, lines 22-23, "indicator 10661" should read --indicator 1066I--.

In column 26, lines 60-61, "horizontal axis 1034." should read --horizontal axis 1034A.--.

In column 26, line 67, after "track ball", insert --1032--.

In column 27, line 2, "plurality axes" should read --plurality of axes--.

In column 28, line 22, "Thus, and any pixel" should read --Thus, any pixel--.

In column 28, line 32, "display 2005" should read --display 2055--.

In column 28, line 51, "detectors," should read --detectors 2061,--.

In claim 13, column 31, lines 56-57, "plurality of language object" should read --plurality of language objects--.

In claim 14, column 31, lines 63-64, "plurality of language object" should read --plurality of language objects--.